(12) United States Patent
Ruzic et al.

(10) Patent No.: US 10,332,731 B2
(45) Date of Patent: Jun. 25, 2019

(54) METHOD OF AND MAGNET ASSEMBLY FOR HIGH POWER PULSED MAGNETRON SPUTTERING

(71) Applicant: The Board of Trustees of the University of Illinois, Urbana, IL (US)

(72) Inventors: David N. Ruzic, Pesotum, IL (US); Ivan A. Shchelkanov, Champaign, IL (US); Priya Raman, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 531 days.

(21) Appl. No.: 14/878,417

(22) Filed: Oct. 8, 2015

(65) Prior Publication Data

US 2016/0104607 A1   Apr. 14, 2016

Related U.S. Application Data

(60) Provisional application No. 62/076,931, filed on Nov. 7, 2014, provisional application No. 62/062,594, filed on Oct. 10, 2014.

(51) Int. Cl.
*C23C 14/34* (2006.01)
*H01J 37/34* (2006.01)
*C23C 14/35* (2006.01)

(52) U.S. Cl.
CPC ............ *H01J 37/345* (2013.01); *C23C 14/35* (2013.01); *H01J 37/3408* (2013.01); *H01J 37/3452* (2013.01); *H01J 37/3467* (2013.01)

(58) Field of Classification Search
CPC .......................... H01J 37/3452; H01J 37/345
See application file for complete search history.

(56) References Cited

U.S. PATENT DOCUMENTS 4,627,904 A    12/1986  Mintz
4,891,560 A *   1/1990  Okumura ............ H01J 37/3266
                                                    204/298.19

(Continued)

FOREIGN PATENT DOCUMENTS

WO    WO 2000/077273 A1    12/2000

OTHER PUBLICATIONS

Alami, J. et al., "High power pulsed magnetron sputtering: Fundamentals and applications", *Journal of Alloys and Compounds*, 483 (2009) pp. 530-534.

(Continued)

*Primary Examiner* — Jason Berman
(74) *Attorney, Agent, or Firm* — Brinks Gilson & Lione

(57) ABSTRACT

A magnet assembly for use in high power pulsed magnetron sputtering comprises a configuration of magnets having a magnetic field topology comprising magnetic field components $B_x$, $B_y$ and $B_z$. A tangential magnetic field $B_{//}$ distribution on an x-y plane above the configuration of magnets comprising an outer continuous ring and one or more inner continuous rings contained in the outer continuous ring. A total magnetic field $B_{tot}$ distribution on an x-z plane intersecting the configuration of magnets comprises an outer closed loop and one or more inner closed loops contained in the outer closed loop, where, as a function of x, a tangential magnetic field $B_{//}$ alternates between (a) high field values greater than 200 G and high gradients in the z-direction of at least 1000 G/in, and (b) low field values of less than 50 G and low gradients in the z-direction of at most 250 G/in.

21 Claims, 16 Drawing Sheets
(8 of 16 Drawing Sheet(s) Filed in Color)

(56) References Cited

U.S. PATENT DOCUMENTS

| | | | |
|---|---|---|---|
| 5,262,030 | A | 11/1993 | Potter |
| 5,417,833 | A | 5/1995 | Harra et al. |
| 5,865,970 | A | 2/1999 | Stelter |
| 6,146,509 | A | 11/2000 | Aragon |
| 6,432,285 | B1 * | 8/2002 | Kastanis ............ H01J 37/3408 204/298.16 |
| 8,388,819 | B2 | 3/2013 | Zhao et al. |
| 2014/0097080 | A1 | 4/2014 | Heinrich et al. |

OTHER PUBLICATIONS

Alami, J. et al., "On the deposition rate in a high power pulsed magnetron sputtering discharge", *Appl. Phys. Lett.*, 89, 154104 (2006) pp. 1-3.

Alami, J. et al., "Plasma dynamics in a highly ionized pulsed magnetron discharge", *Plasma Sources Sci. Technol.*, 14 (2005) pp. 525-531.

Anders, André, "Discharge physics of high power impulse magnetron sputtering", *Surface & Coatings Technology*, 205 (2011) pp. S1-S9.

Anders, André, "Self-sputtering runaway in high power impulse magnetron sputtering: The role of secondary electrons and multiply charged metal ions", *Appl. Phys. Lett.*, 92, 201501 (2008) pp. 1-3.

Čapek, J. et al., "Deposition rate enhancement in HiPIMS without compromising the ionized fraction of the deposition flux", *J. Phys. D: Appl. Phys.*, 46 (2013) 205205 (10 pp.).

Fetisov, I. K. et al., "Impulse irradiation plasma technology for film deposition", *Vacuum*, 53 (1999) pp. 133-136.

Gudmundsson, Jón Tómas, "The High Power Impulse Magnetron Sputtering (HiPIMS) Discharge", The 3rd International Conference on Microelectronics and Plasma Technology, Dalian, China, Jul. 5, 2011 (55 pp.).

Helmersson, Ulf et al., "Review Ionized physical vapor deposition (IPVD): A review of technology and applications", *Thin Solid Films*, 513 (2006) pp. 1-24.

Kelly, P. J. et al., "Magnetron sputtering: a review of recent developments and applications", *Vacuum*, 56 (2000) pp. 159-172.

Kouznetsov, Vladimir et al., "A novel pulsed magnetron sputter technique utilizing very high target power densities", *Surface and Coatings Technology*, 122 (1999) pp. 290-293.

Liebig, B. et al., "Space charge, plasma potential and electric field distributions in HiPIMS discharges of varying configuration", *Plasma Sources Sci. Technol.*, 22 (2013) 045020 (11 pp.).

Mozgrin, D. V. et al., "High-Current Low-Pressure Quasi-Stationary Discharge in a Magnetic Field: Experimental Research", *Plasma Physics Reports*, 21, 5 (1995) pp. 400-409.

Papa, F. et al., "Deposition rate characteristics for steady state high power impulse magnetron sputtering (HIPIMS) discharges generated with a modulated pulsed power (MPP) generator", *Thin Solid Films*, 520 (2011) pp. 1559-1563.

Ritz, Eithan et al., "Atmospheric pressure dielectric barrier discharge (DBD) for post-annealing of aluminum doped zinc oxide (AZO) films", *Surface & Coatings Technology*, 251 (2014) pp. 64-68.

Sigurjónsson, Páll et al., "Langmuir probe study of the plasma parameters in the HiPIMS discharge", SVC 52nd Annual Technical Conference, Santa Clara, California, May 13, 2009 (22 pp.).

Svadkovski, I.V. et al., "Characterisation parameters for unbalanced magnetron sputtering systems", *Vacuum*, 68 (2003) pp. 283-290.

Thornton, John A., "Magnetron sputtering: basic physics and application to cylindrical magentrons"; *Journal of Vacuum Science & Technology*, 15, 171 (1978), pp. 171-177.

Window, B. et al., "Charged particle fluxes from planar magnetron sputtering sources", *J. Vac. Sci. Technol. A*, 4, 2 (1986) pp. 196-202.

Meng, L. et al., "Downstream Plasma Transport and Metal Ionization in a High-Powered Pulsed-Plasma Magnetron," *Journal of Applied Physics* 115, (2014) pp. 223301-1-223301-9.

Yu, H. et al., "Investigation and Optimization of the Magnetic Field Configuration in High-Power Impulse Magnetron Sputtering," *Plasma Sources Sci. Technol.* 22 (2013) pp. 045012-1-045012-11.

* cited by examiner

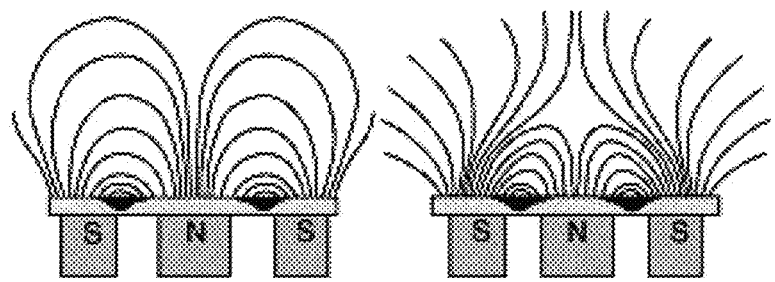
FIG. 1A
(prior art)
FIG. 1B
(prior art)
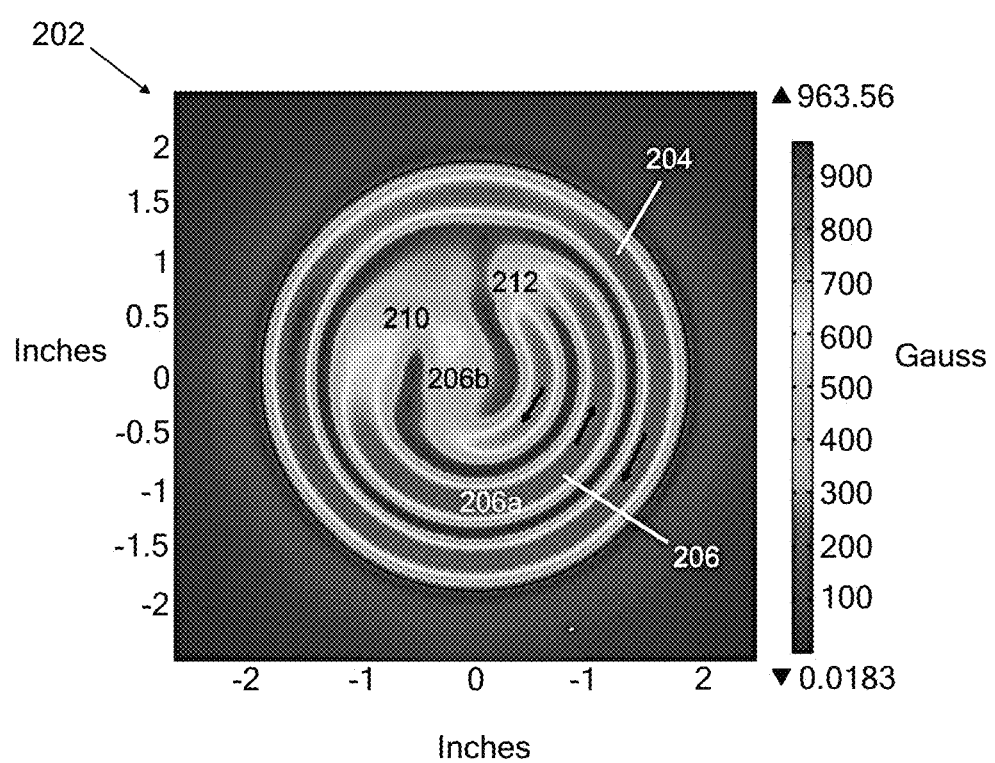
FIG. 2

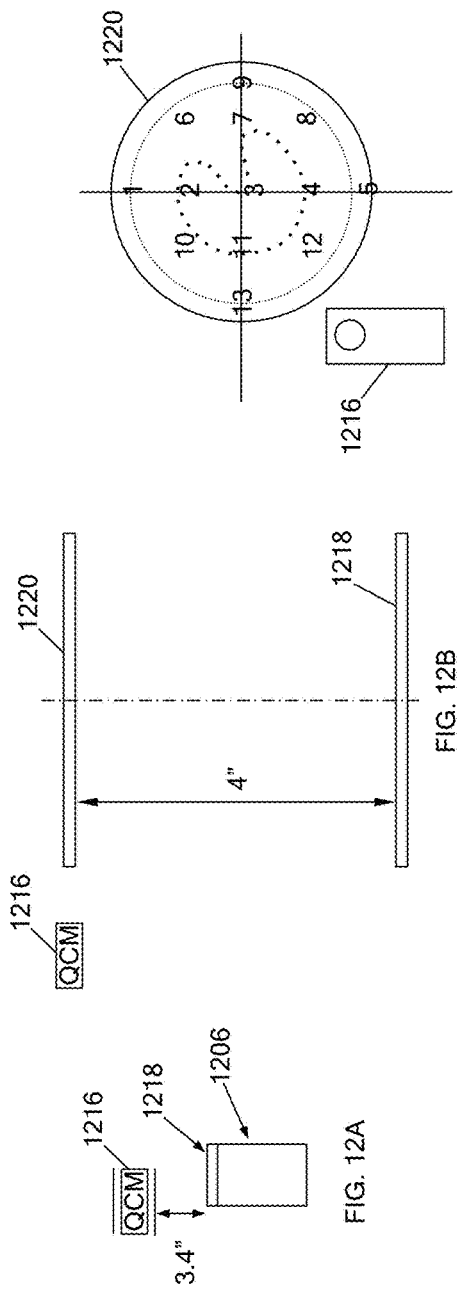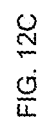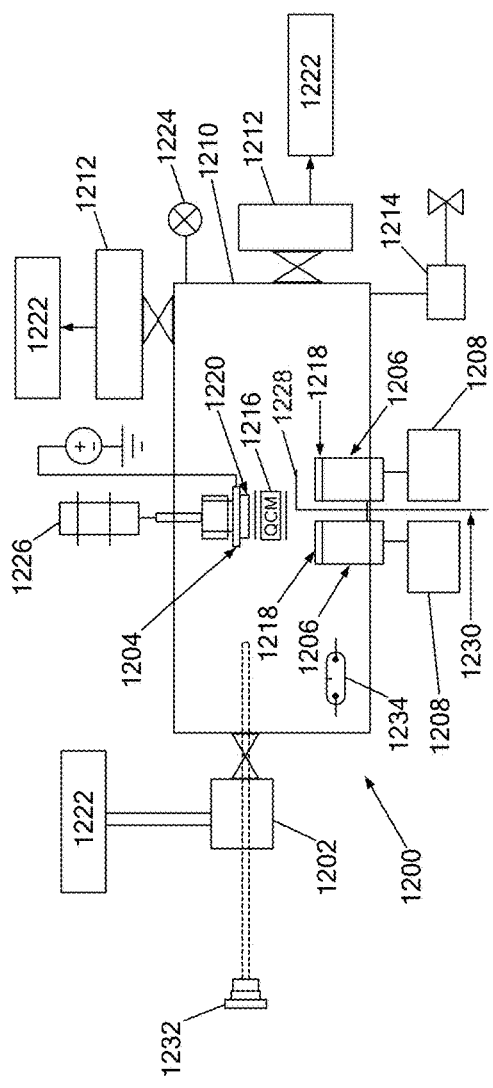

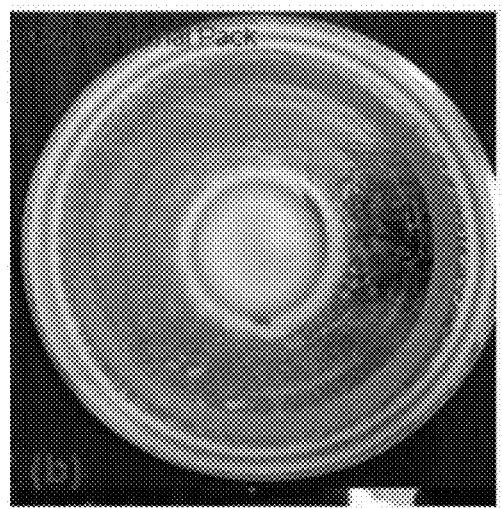
FIG. 16A  FIG. 16B
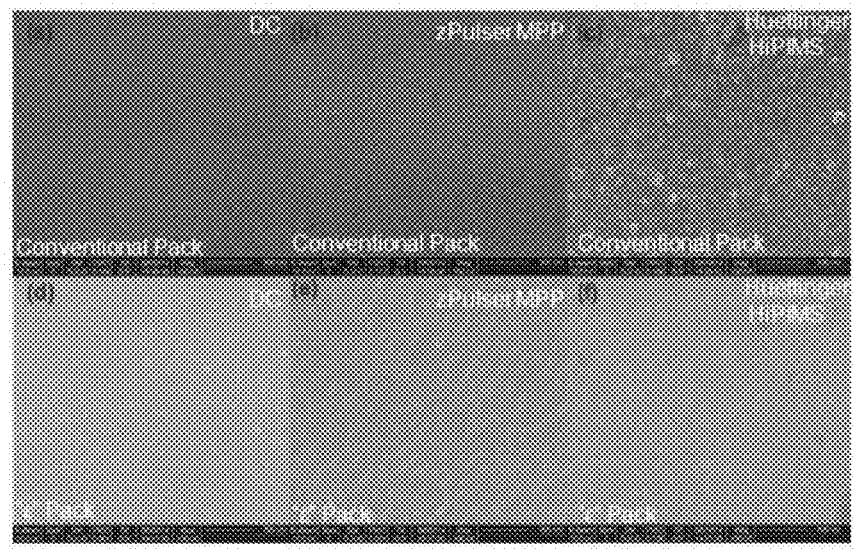
FIGS. 17A-17F

METHOD OF AND MAGNET ASSEMBLY FOR HIGH POWER PULSED MAGNETRON SPUTTERING

RELATED APPLICATIONS

The present patent document claims the benefit of priority under 35 U.S.C. § 119(e) to U.S. Provisional Patent Application Ser. No. 62/076,931, filed Nov. 7, 2014, and to U.S. Provisional Patent Application Ser. No. 62/062,594, filed Oct. 10, 2014, both of which are hereby incorporated by reference in their entirety.

FEDERALLY SPONSORED RESEARCH OR DEVELOPMENT

This invention was made with government support under contract number IIP0934400 awarded by the National Science Foundation. The government has certain rights in the invention.

TECHNICAL FIELD

The present disclosure is related generally to magnetron sputtering and more particularly to a configuration of magnets for high power pulsed magnetron sputtering.

BACKGROUND

Physical vapor deposition (PVD) techniques are widely used to deposit high quality coatings for a wide range of industries, ranging from microelectronics and liquid crystal displays (LCDs) to architectural glass and DVDs. The need for high performance coatings has increased steadily over the years. Sputtering, which involves the transfer of a material from a sputtering target to a substrate, is one of several methods used for the PVD of thin films.

To initiate sputtering, the sputtering target is biased with a negative voltage. A sputtering source (or "gun") supplies the electrical means to bias the target. A gas such as argon (the "working gas") is ionized between the cathode (target) and the anode, forming a plasma containing positive argon ions and free electrons. The plasma is characterized by a visible glow and increased electric conductivity.

The free electrons in the plasma may be accelerated toward the anode, colliding with other gas atoms in their path and further ionizing the gas. The negatively charged target attracts the positive ions from the plasma. The positive ions are accelerated to a high kinetic energy and strike the surface of the target structure, where part of the kinetic energy is converted to heat, and the remainder of the energy is imparted to atoms of the target material by momentum transfer. Target atoms that gain sufficient energy to overcome their binding energy escape from the target surface and may be deposited on a substrate or object placed in opposition to the target, forming a coating.

In addition to biasing the target, the sputtering source may allow cooling of the target structure and may provide a magnetic field to contain and enhance the plasma. The magnetic field causes electrons in the plasma to follow curved trajectories. A longer (curved) path increases the probability of collision with gas atoms in the chamber. Such collisions produce additional gas ions, thereby increasing the sputtering rate. The deposition rates achieved by magnetron sputtering are typically several orders of magnitude higher than those attained by conventional sputtering processes, and the magnetic field configuration above the target may allow a stable discharge current to be maintained at lower pressures.

Ionized PVD (iPVD) is a class of PVD where the deposition flux from the sputtering target includes an increased fraction of ionized material. Since ion energy and direction can be controlled, iPVD techniques may be used in a wide variety of applications such as the formation of diffusion barriers and seed layers on the side and bottom of high aspect ratio trenches and vias in the microelectronics industry.

High power pulsed magnetron sputtering (HPPMS) is a type of iPVD technique where short, high peak power pulses are applied to the sputtering target at low duty cycles, which may generate plasma electron densities as high as $10^{19}$ m$^{-3}$ above the target surface during the power pulses. Such high electron densities near the target may enhance ionization of sputtered material. Some of the ionized sputtered material may be accelerated back to the target, resulting in an increase in the sputtering rate, while some sputtered ions may escape and be deposited on the substrate as a high quality film. Thin films deposited using the HPPMS technique may be denser and smoother and may have better adhesion to the substrate than films deposited by direct current (DC) magnetron sputtering.

Conventional magnet assemblies for magnetron sputtering have one of two magnetic field configurations: an unbalanced or a balanced magnetic flux, as illustrated in FIGS. 1A and 1B, respectively. These configurations can be distinguished by the coefficient of unbalance K, which is the ratio of magnetic fluxes from the central and peripheral magnets on the target surface:

$$K = \frac{\Phi_1}{\Phi_2} = \frac{\int_{S_1} B_{\perp 1} dS}{\int_{S_2} B_{\perp 2} dS}$$

where $B_{\perp 1}$ and $S_1$ are the component of the magnetic field perpendicular to the target surface and the cross-sectional area of the outer magnets, respectively, and where $B_{\perp 2}$ and $S_2$ are the component of magnetic field perpendicular to the target surface and the cross-sectional area of the central magnets, respectively. When the magnetic fluxes of outer and central poles are equal (K=1), all lines of the magnetic field are closed between the poles. For K>1, the magnetic flux at the outer pole exceeds the magnetic flux at the central pole, and some of the magnetic lines at the outer pole are open, producing the unbalanced configuration.

The coefficient K reflects the magnetic field line topology, which influences the deposition rate and ion/atom flux distribution on the substrate. These conventional configurations have at least one element in common: the magnetic field above the target has a non-zero component parallel to the target across the entire target. The resulting magnetic field, in conjunction with the electric field, acts as a trap to direct ions back to the target.

The DC magnetron sputtering process is well studied and there are mathematical models to predict and optimize the deposition rates in these discharges. Significantly lower deposition rates have been reported for HPPMS compared to DC magnetron sputtering. Some of the possible reasons for this are: (1) the "return effect" of metal ions, where the sputtered metal ions are attracted back towards the target; (2) magnetic confinement influences on deposition rate and (3) movement of sputtered ions in a sideways direction from the target. Once the HPPMS discharge gets to a state with higher fraction of ionized sputtered material, the electric field distribution inside the plasma may change and prevent ions from escaping the plasma region. The plasma electric potential during the discharge may control the movement of ions, and thus it may be important to modify the electric potential distribution in the plasma during discharge to increase the ion flow from the trap.

BRIEF SUMMARY

A magnet assembly for use in high power pulsed magnetron sputtering comprises a configuration of magnets having a magnetic field topology comprising magnetic field components $B_x$, $B_y$ and $B_z$, where x- and y-directions are parallel to the configuration of magnets and a z-direction is normal to the configuration of magnets. A tangential magnetic field $B_{//}$ distribution on an x-y plane above the configuration of magnets comprises an outer continuous ring and one or more inner continuous rings contained in the outer continuous ring. A total magnetic field $B_{total}$ distribution on an x-z plane intersecting the configuration of magnets comprises an outer closed loop and one or more inner closed loops contained in the outer closed loop, where, as a function of x, a tangential magnetic field $B_{//}$ alternates between (a) high field values greater than 200 G and high gradients in the z-direction of at least 1000 G/in, and (b) low field values of less than 50 G and low gradients in the z-direction of at most 250 G/in.

A method of high power pulsed magnetron sputtering comprises positioning a backside of a sputtering target adjacent to a configuration of magnets in a vacuum chamber, a front surface of the sputtering target being positioned in opposition to a workpiece to be coated. A pulsed plasma is generated at the front surface of the sputtering target at a pulsed voltage of at least about 400 V for at least about 10 microseconds to remove atoms from the sputtering target. During generation of the plasma, (1) a current density of at least about 100 mA/cm² is retained on at least a portion of the front surface of the sputtering target in order to ionize at least some of the atoms removed from the sputtering target, thereby generating a sufficient current to sustain the pulsed plasma, and (2) an ionization zone is created between the pulsed plasma and the workpiece away from the front surface of the sputtering target, the ionization zone having a sufficient electron density and temperature to ionize an additional fraction of the atoms removed from the sputtering target and having a sufficiently low electric field to allow ionized atoms created therein to transit to the workpiece for deposition at a high rate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A and 1B show conventional magnetron field configurations, including unbalanced (FIG. 1A) and balanced (FIG. 1B).

FIG. 2 shows a tangential magnetic field $B_{//}$ distribution 202 on an x-y plane above an exemplary configuration of magnets (the "Epsilon magnet assembly").

FIGS. 12A-12D show schematics of the set-up of sputtering high-purity atomic deposition experiment (SHADE), which is a dual magnetron set-up for depositing thin films in a vacuum environment.

FIGS. 16A and 16B show the erosion pattern formed on a sputtering target used with the conventional magnet assembly and on a sputtering target used with the Epsilon magnet assembly.

FIGS. 17A-17F are scanning electron microscope (SEM) images showing the grain size of the deposited films as a function of the power supply used for deposition.

DETAILED DESCRIPTION

Described herein is a magnet assembly for high power pulsed magnetron sputtering (HPPMS) which is designed to provide a balance between electron trapping and sputtered ion leakage. The magnet assembly may allow sputter deposition rates of up to two times higher than conventional magnet packs, as well as reduced arcing.

The magnet assembly comprises a configuration of magnets having a magnetic field topology comprising magnetic field components $B_x$, $B_y$, and $B_z$. The x- and y-directions are parallel to the configuration of magnets and a z-direction is normal to the configuration of magnets. A total magnetic field $B_{tot} = \sqrt{B_x^2 + B_y^2 + B_z^2}$, and a tangential magnetic field $B_{//} = \sqrt{B_x^2 + B_y^2}$. When used for HPPMS, a sputtering target is positioned above the configuration of magnets in the positive z direction. Typically, a front surface of the sputtering target (i.e., the surface to be sputtered) is positioned from about 0.15 inch to about 0.5 inch above the top of the configuration of magnets. The front surface of the sputtering target may thus be within about 0.5 inch, within about 0.4 inch, within about 0.3 inch or within about 0.2 inch of the configuration of magnets.

Figure 3A:
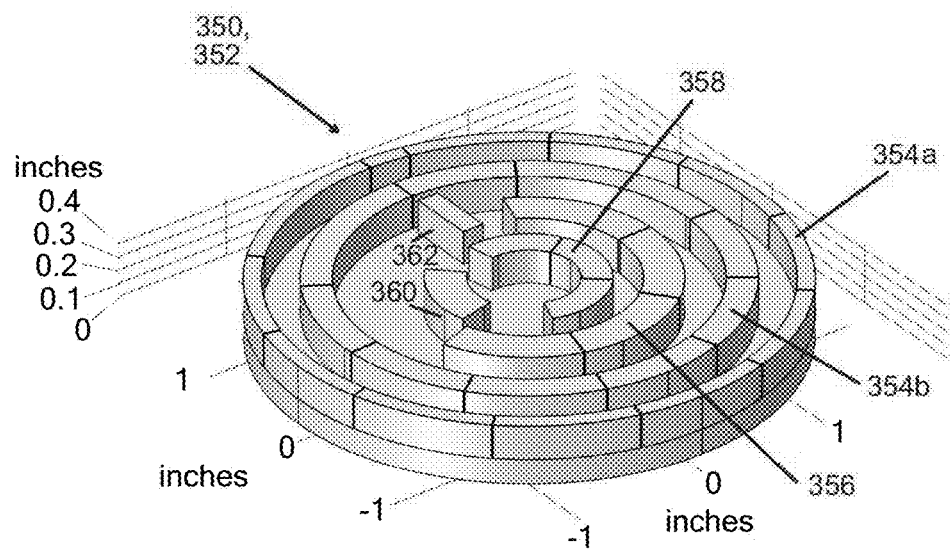
FIGS. 3A and 3B show perspective and top views, respectively, of the configuration of magnets that produced the tangential magnetic field $B_{//}$ distribution of FIG. 2.
Figure 3B:
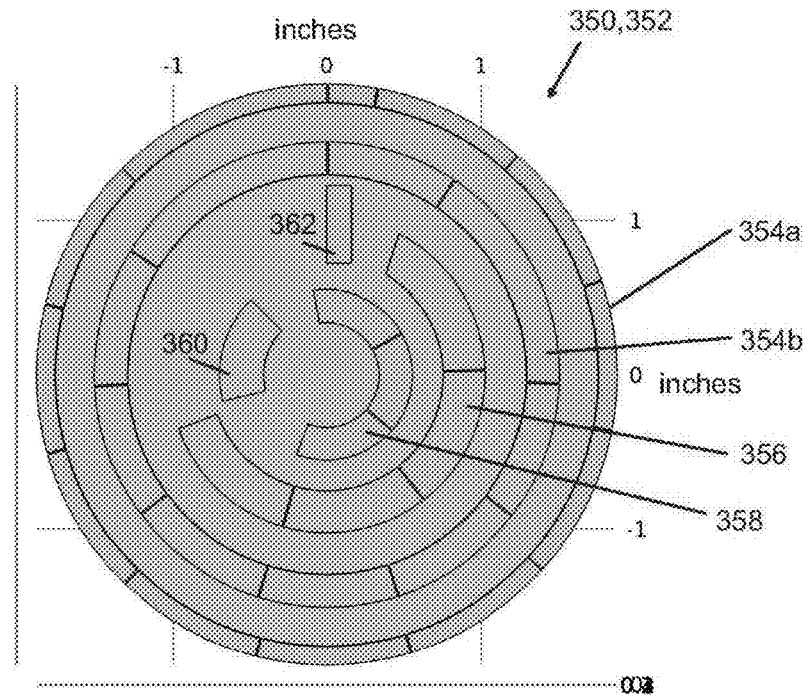

FIG. 2 shows a tangential magnetic field $B_{//}$ distribution 202, as determined by finite element analysis simulations, on an x-y plane above an exemplary configuration of magnets, which may be referred to as the "Epsilon magnet pack" or the "Epsilon magnet assembly." The x-y plane is at a position in the z-direction where the front surface of the sputtering target may be located during sputtering. The Epsilon magnet assembly is shown in FIGS. 3A and 3B, and the finite element simulations used to obtain the magnetic field distributions are described in the experimental details provided below.

Referring again to FIG. 2, the tangential magnetic field $B_{//}$ distribution 202 for the Epsilon magnet pack comprises an outer continuous ring 204 and an inner continuous ring 206 contained in the outer continuous ring 204. The outer continuous ring 204 has a substantially constant radius over the entire circumference of the ring 204, while the inner continuous ring 206 has a substantially constant radius over a first portion 206a of the ring 206 that accounts for no more than about 300° of the circumference. A second portion 206b of the inner continuous ring 206 has the appearance of having been stretched and pushed in a radial direction toward the center of the inner continuous ring 106. Thus, there is a sharp turn 210 of greater than 90° separating the first portion 206a from the second portion 206b of the inner continuous ring 206 at a first circumferential location, and a sharp turn 212 of greater than 90° separating the second portion 206b from the first portion 206a at a second circumferential location. A gradient of the tangential magnetic field $B_{//}$ in the x-y plane along the course of either ring 204, 206, which may be referred to as the race track, is preferably less than about 200 G/in, and may be less than about 100 G/in, or less than about 50 G/in.

The direction of the tangential magnetic field $B_{//}$ changes by about 180° between the outer continuous ring 204 and the inner continuous ring 206 in at least some locations. For example, in the first portion 206a of the inner continuous ring 206, at any arbitrary location, the magnetic field direction is changed by about 180° compared to a radially adjacent location in the outer continuous ring 204, as illustrated by the arrows.

For this configuration of magnets, an average value of the tangential magnetic field $B_{//}$ in the inner continuous ring 206 is less than an average value of the tangential magnetic field $B_{//}$ in the outer continuous ring 204. The tangential magnetic field $B_{//}$ in the outer continuous ring 204 may have a value of from about 150 G to about 1000 G, or from about 600 G to about 1000 G, whereas the tangential magnetic field $B_{//}$ in the inner continuous ring may have a value from about 200 G to about 850 G, or from about 400 G to about 850 G. The tangential magnetic field $B_{//}$ of the outer continuous ring 204 provides stable ignition at lower pressures and a constant electron feed into the inner continuous ring 206. The lower tangential magnetic field $B_{//}$ of the inner continuous ring 206 sustains an electron leakage from the inner continuous ring 206. These features are believed to contribute to a higher ion flux along the central axis of the configuration of magnets in the z-direction away from the target. Although this configuration of magnets has a region of electron leakage, it can achieve a sustainable high current pulsed discharge regime and set up a potential distribution that allows more ions to escape. Electron confinement and loss paths are shown by the simulated electron trajectories of FIGS. 13A-13E, which are further described in the Examples below.

Figure 4:
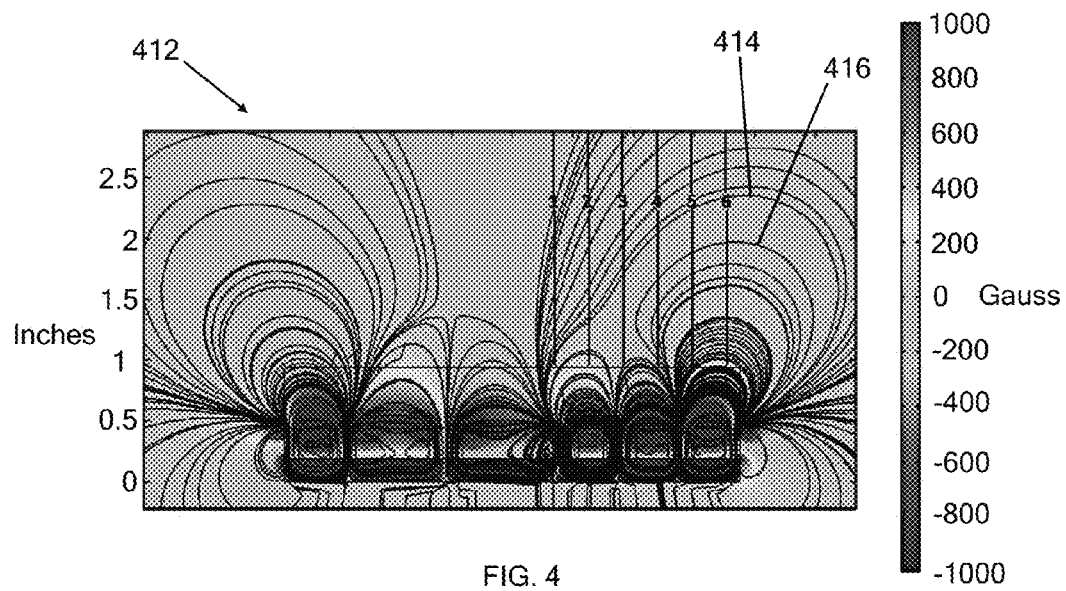
FIG. 4 shows a total magnetic field $B_{total}$ distribution for the Epsilon magnet assembly on an x-z plane that intersects the configuration of magnets.
Figure 5:
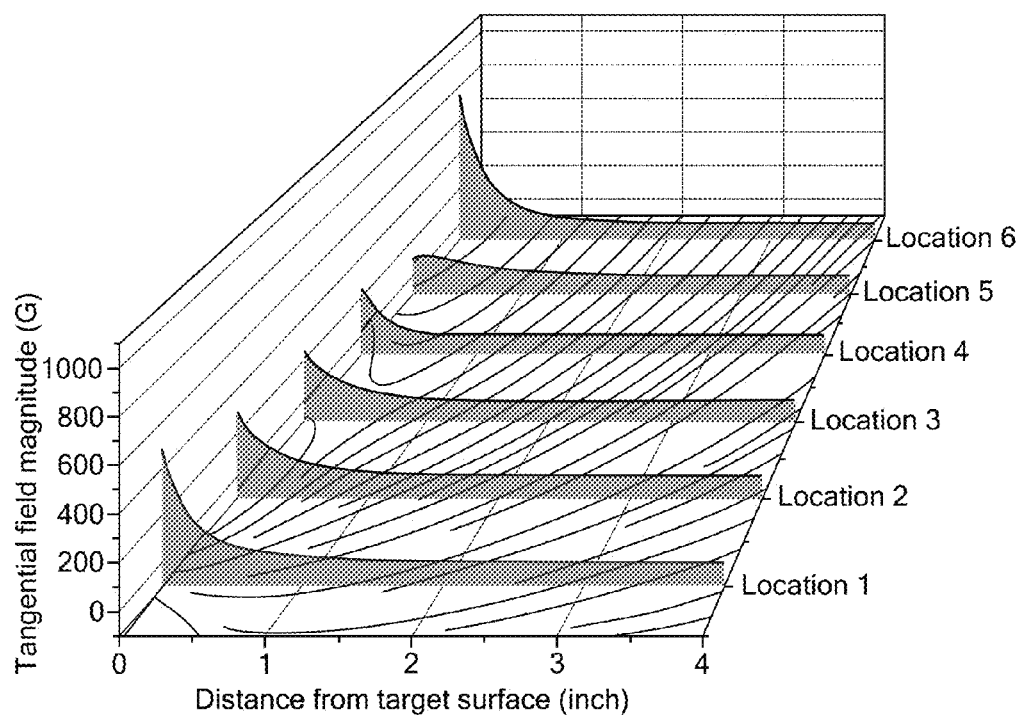
FIG. 5 shows values of the tangential magnetic field $B_{//}$ at each of the x-direction locations identified in FIG. 4 for increasing values of z away from the front surface of a sputtering target positioned above the configuration of magnets.
Figure 6:
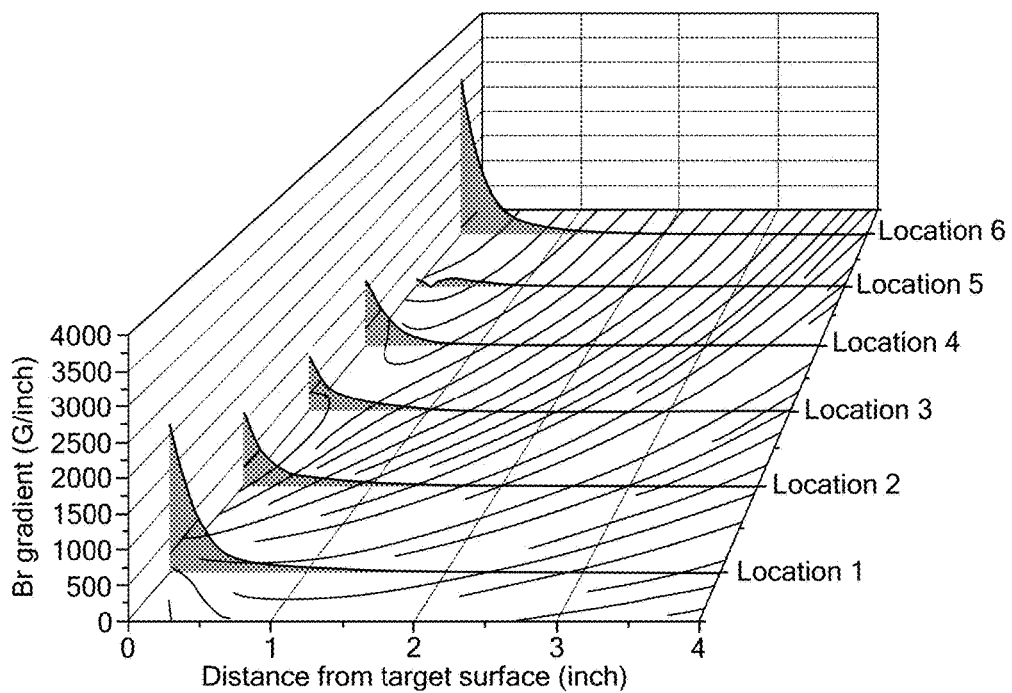
FIG. 6 shows values of the z-direction gradient of the tangential magnetic field $B_{//}$ at each of the x-direction locations identified in FIG. 4 for increasing values of z away from the front surface of a sputtering target positioned above the configuration of magnets.

FIG. 4 shows a total magnetic field $B_{tot}$ distribution for the Epsilon magnet pack on an x-z plane that intersects the configuration of magnets, as determined by finite element analysis simulations. The total magnetic field $B_{tot}$ distribution 412 comprises an outer closed loop 414 and one or more inner closed loops 416 contained in the outer closed loop 414. The outer closed loop 414 may extend over an entirety of the configuration of magnets, or over only a portion (e.g., at least about 30% of the total width (or diameter) of the configuration of magnets, at least about 40%, or at least about 50%). Six arbitrary locations in the x-direction moving outward from the center of the configuration of magnets are indicated in FIG. 4 (labeled 1, 2 . . . 6). FIG. 5 shows values of the tangential magnetic field $B_{//}$ at each of these locations for increasing values of z away from the front surface of the sputtering target. The zero value shown on the z axis corresponds to a distance of 0.29 inch away from the configuration of magnets, in this example. FIG. 6 shows values of the z-direction gradient of the tangential magnetic field $B_{//}$ at each of the x-direction locations for increasing values of z away from the front surface of the sputtering target. As in FIG. 5, the zero value shown on the z axis corresponds to a distance of 0.29 inch above the configuration of magnets.

As a function of x across the configuration of magnets at values of z near the target surface (which in general may be positioned within 0.15 inch to about 0.5 inch from the configuration of magnets), the tangential magnetic field $B_{//}$ may alternate between high field values and low field values, and the gradient of the tangential magnetic field $B_{//}$ in the z-direction may alternate between high gradients and low gradients. As can be seen by comparing FIGS. 5 and 6, regions comprising a high field may also comprise a high gradient, and regions comprising a low field may also comprise a low gradient. Low gradient regions may allow electrons to transfer between different inner closed loops 416 of the magnetic field (see FIG. 4) without escaping the plasma. Low field regions trap electrons less effectively than higher field regions, and thus they do not exhibit a large potential drop that strongly attracts sputtered ions. Instead, sputtered ions can more easily escape from these regions for deposition on the target.

Referring again to FIGS. 3A and 3B, which show the configuration of magnets (the Epsilon pack) that yields the tangential magnetic field $B_{//}$ distribution shown in FIG. 2 (x-y plane) and FIG. 4 (x-z plane), it can be seen that the configuration 350 includes a plurality of magnets 352 arranged to define two complete outer magnet rings 354a, 354b and two partial inner magnet rings (a larger partial inner magnet ring 356 and a smaller partial inner magnet ring 358) inside the outer magnet rings 354a,354b. Each of the outer magnet rings 354a,354b has a substantially constant radius over the entire circumference of the ring. The smaller partial inner magnet ring 358 has a smaller radius and circumferential length than the larger inner magnet ring 356, and is positioned radially inside it. A curved, circumferentially-oriented magnet piece 360 may be positioned between an end of the smaller inner magnet ring 358 and an end of the larger inner magnet ring 356. A straight, radially-oriented magnet piece 362 may be positioned adjacent to an end of the larger partial inner magnet ring 356, as illustrated in FIGS. 3A and 3B. Each magnet of the complete outer magnet rings 354a,354b and the two partial inner magnet rings 356,358 may be curved. The magnet assembly 350 of this example is sized to fit commercially available small-size sputter sources, such as the 4-inch TORUS® of Kurt J. Lesker Co. (Jefferson Hills, Pa.). The configuration of magnets shown in FIGS. 3A and 3B span a circular area having a diameter of about 4 inches. However, the design could be scaled to other diameters, depending on the size of the magnetron sputter source.

Figures 7A, 7B:
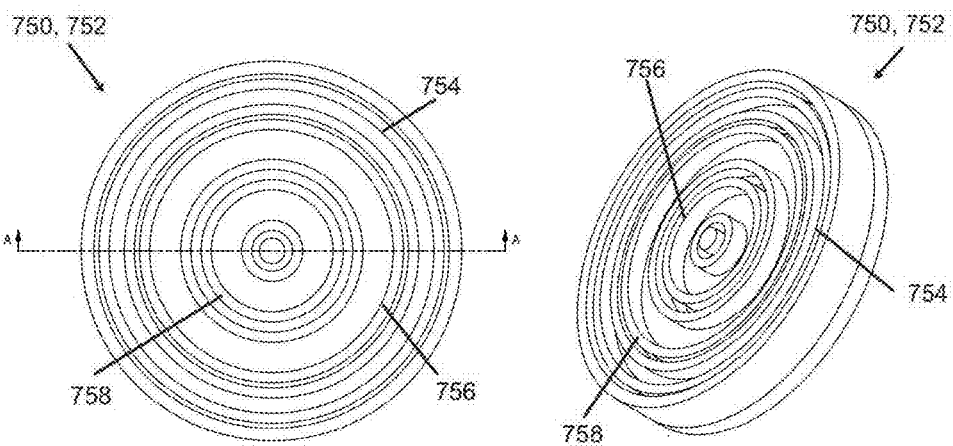
FIGS. 7A-7C show top, perspective and cross-sectional views, respectively, of another exemplary configuration of magnets ("TriPIMS magnet assembly"), where the indicated dimensions are merely examples.
Figure 7C:
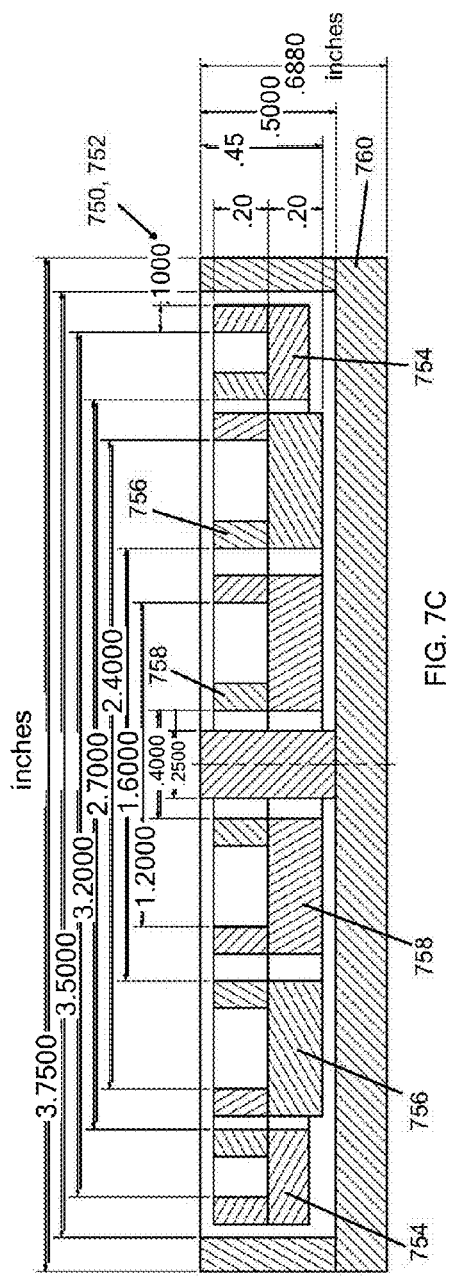

Several views of another exemplary magnet assembly 750 are shown in FIGS. 7A-7C. This configuration of magnets 752 may be referred to as the "TriPIMS magnet pack" or the "TriPIMS magnet assembly," where PIMS stands for Powerful Impulse Magnetron Sputtering. The TriPIMS magnet assembly 750 includes a plurality of magnets 752 arranged to define three concentric magnet rings: an outer magnet ring 754 and two inner magnet rings 756,758 positioned inside the outer magnet ring 754. Each of the outer and inner magnet rings 754,756,758 are circular in shape with a substantially constant radius. The magnets that define the two inner magnet rings 756,758 may have the same width in the radial direction ("radial width"), and the radial width of each of the two inner magnet rings 756,758 may be larger than the radial width of the outer magnet ring 754, as evidenced in FIG. 7C. Each of the outer and inner magnet rings 754,756,758 may be formed from a plurality of magnets placed adjacent to each other to form a ring shape or from a continuous ring-shaped magnet. The magnet assembly 750 of this example is sized to fit commercially available small-size sputter sources, such as the 4-inch TORUS® of Kurt J. Lesker Co. (Jefferson Hills, Pa.). The configuration of magnets described above spans a circular area having a diameter of about 3.8 inches, including the mounting plate 760, as shown in FIG. 7C. However, the design could be scaled to other diameters, depending on the size of the magnetron sputter source.

Figure 8:
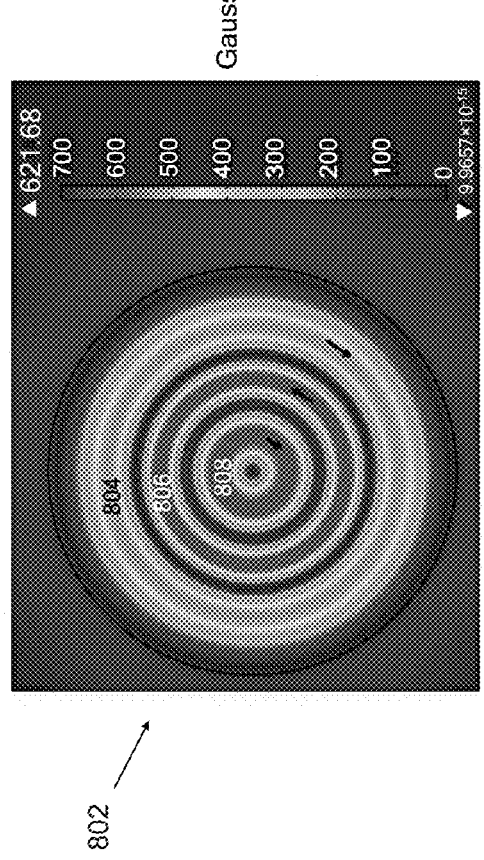
FIG. 8 shows a tangential magnetic field $B_{//}$ distribution 202 on an x-y plane above the TriPIMS magnet assembly.

FIG. 8 shows a tangential magnetic field $B_{//}$ distribution 802 on an x-y plane above the configuration of magnets shown in FIGS. 7A-7C. The x-y plane is at a position in the z-direction where the front surface of the sputtering target may be located during sputtering. The tangential magnetic field $B_{//}$ distribution 802 comprises an outer continuous ring 804 and an inner continuous ring 806 contained in the outer continuous ring 804. The tangential magnetic field $B_{//}$ distribution further comprises an innermost continuous ring 808 contained in the inner continuous ring 806. The outer, inner, and innermost continuous rings 804,806,808 (or race tracks) of the tangential magnetic field $B_{//}$ distribution are concentrically arranged, and each of the rings comprises a circular shape.

In this example, the outer continuous ring 804 of the tangential magnetic field $B_{//}$ distribution on the x-y plane comprises an average value of the tangential magnetic field $B_{//}$ less than an average value of the tangential magnetic field $B_{//}$ of the inner or innermost continuous ring 806,808. Generally speaking, the tangential magnetic field $B_{//}$ in the outer continuous ring 804 may have a value of from about 350 G to about 1025 G, or from about 450 G to about 1025 G, whereas the tangential magnetic field $B_{//}$ in the inner continuous ring may have a value from about 200 G to about 900 G, or from about 400 G to about 900 G. The direction of the tangential magnetic field $B_{//}$ changes by about 180° between the outer continuous ring 804 and the inner continuous ring 806, and between the inner continuous ring 806 and the innermost continuous ring 808, in all locations, as indicated by the arrows. A gradient of the tangential magnetic field $B_{//}$ in the x-y plane along the path of any of the rings 804,806,808 (or race tracks) is preferably less than about 200 G/in, and may be less than about 100 G/in, or less than about 50 G/in.

Figure 9:
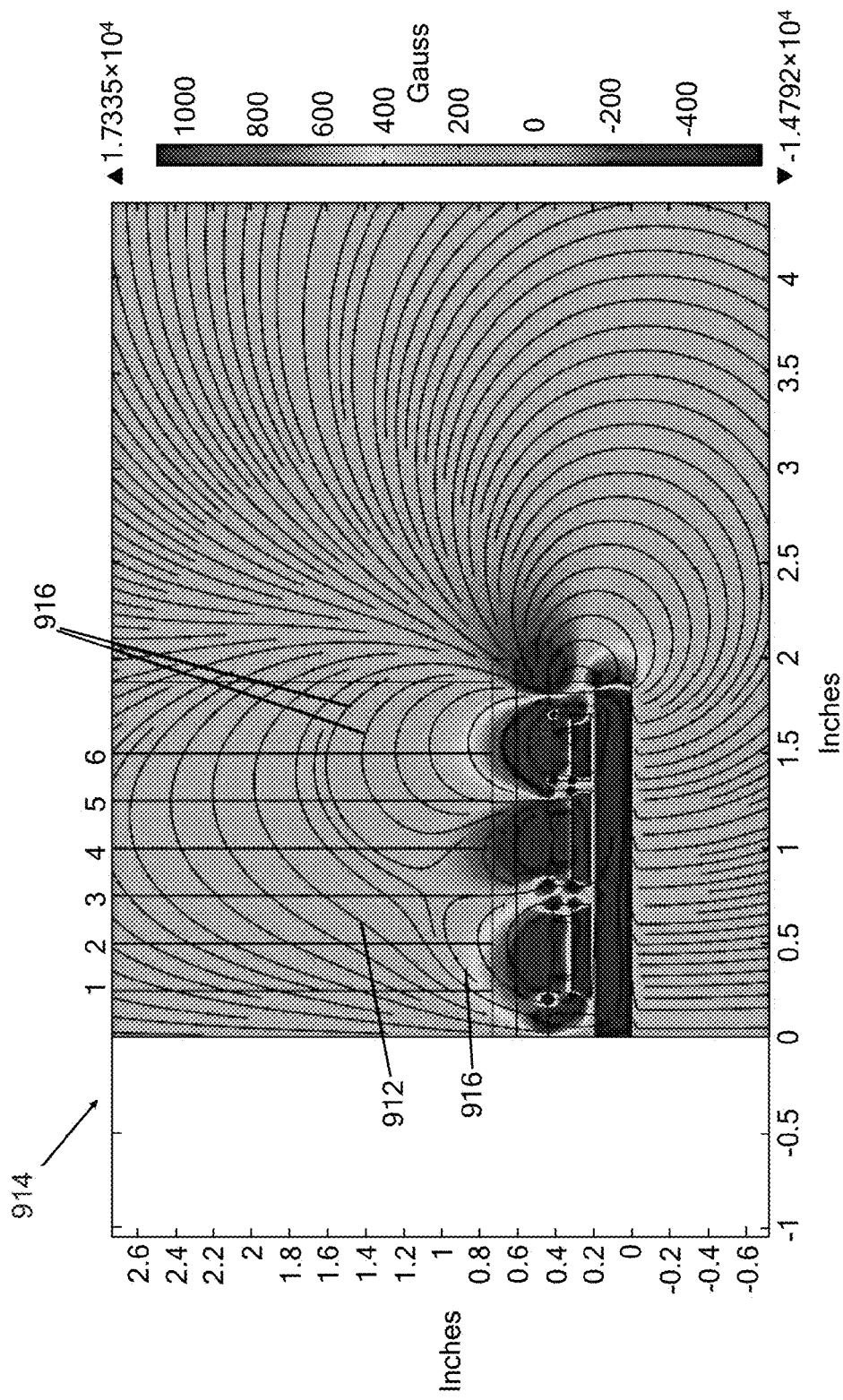
FIG. 9 shows a total magnetic field $B_{tot}$ distribution for the TriPIMS magnet assembly on an x-z plane that intersects the configuration of magnets.
Figure 10:
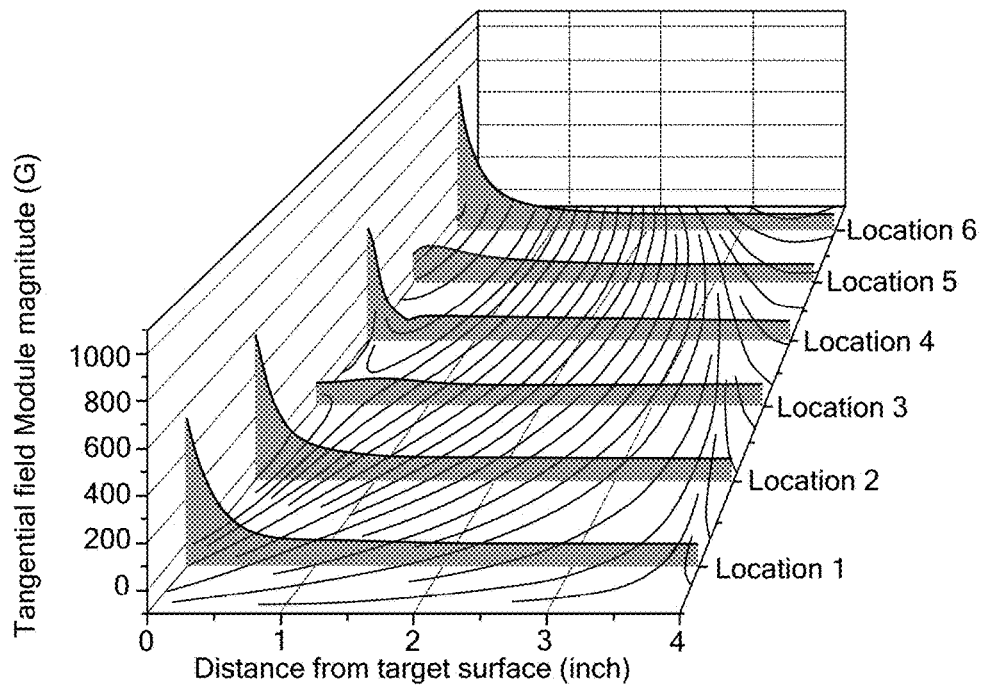
FIG. 10 shows values of the tangential magnetic field $B_{//}$ at each of the x-direction locations identified in FIG. 9 for increasing values of z away from the front surface of a sputtering target positioned above the configuration of magnets.
Figure 11:
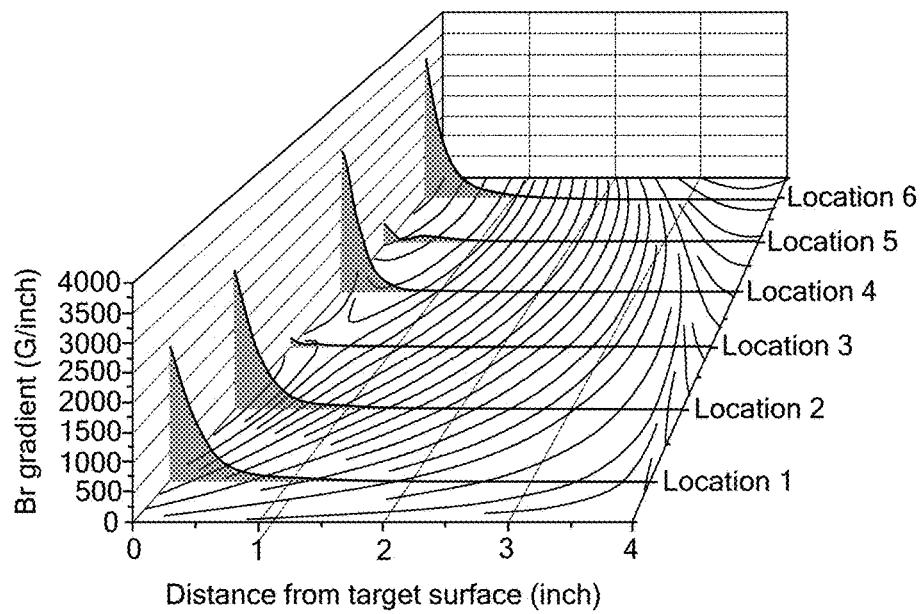
FIG. 11 shows values of the z-direction gradient of the tangential magnetic field $B_{//}$ at each of the x-direction locations identified in FIG. 9 for increasing values of z away from the front surface of a sputtering target positioned above the configuration of magnets.

FIG. 9 shows a total magnetic field $B_{tot}$ distribution for the TriPIMS magnet pack on an x-z plane that intersects the configuration of magnets, as determined by finite element analysis simulations. The total magnetic field distribution $B_{tot}$ 914 comprises an outer closed loop 912 and one or more inner closed loops 916 contained in the outer closed loop 912. Six arbitrary locations in the x-direction moving outward from the center of the configuration of magnets are indicated in FIG. 9 (labeled 1, 2 ... 6). FIG. 10 shows values of the tangential magnetic field $B_{//}$ at each of these locations for increasing distances away from the front surface of a sputtering target positioned above the configuration of magnets. In this example, the front surface of the target is 0.29 inch above the magnets. FIG. 11 shows values of the z-direction gradient of the tangential magnetic field $B_{//}$ at each of the x-direction locations for increasing values of z away from the front surface of the target. As in FIG. 10, the zero value shown on the z axis corresponds to a distance of 0.29 inch away from the configuration of magnets.

As a function of x across the configuration of magnets near the target surface (which in general may be positioned within about 0.15 inch to 0.5 inch from the configuration of magnets), the tangential magnetic field $B_{//}$ may alternate between high field values and low field values, and the gradient of the tangential magnetic field $B_{//}$ in the z-direction may alternate between high gradients and low gradients. As can be seen by comparing FIGS. 10 and 11, regions comprising a high field may also comprise a high gradient, and regions comprising a low field may also comprise a low gradient. As explained above, low gradient regions may allow electrons to transfer between different inner closed loops 916 without escaping the plasma. Low field regions trap electrons less effectively than higher field regions, and thus they do not exhibit a large potential drop that strongly attracts sputtered ions. Instead, sputtered ions may more easily escape from these regions for deposition on the target.

An advantage of the magnet configurations described above is that the magnetic field regions may provide an efficient "cross talk" between the inner closed loop(s) inside the outer closed loop. What is meant by cross talk is that when a plasma is ignited inside the magnetic field, it is confined within the race tracks, which have a very strong interaction. This interaction can lead to current stabilization—i.e., many fewer arcs—and an increased deposition rate.

As described above, the TriPIMS magnet pack generates three race tracks. The term race track may refer to the area above the target where plasma electrons form a region with electric current due to the drift of charged particles inside crossed electric and magnetic fields. The outer closed loop allows the plasma to be contained inside the inner closed loops and to very efficiently exchange between race tracks through charged particles, electric and magnetic fields and electromagnetic waves. The cross talk effect is illustrated in FIGS. 18A and 18B.

Figures 18A, 18B:
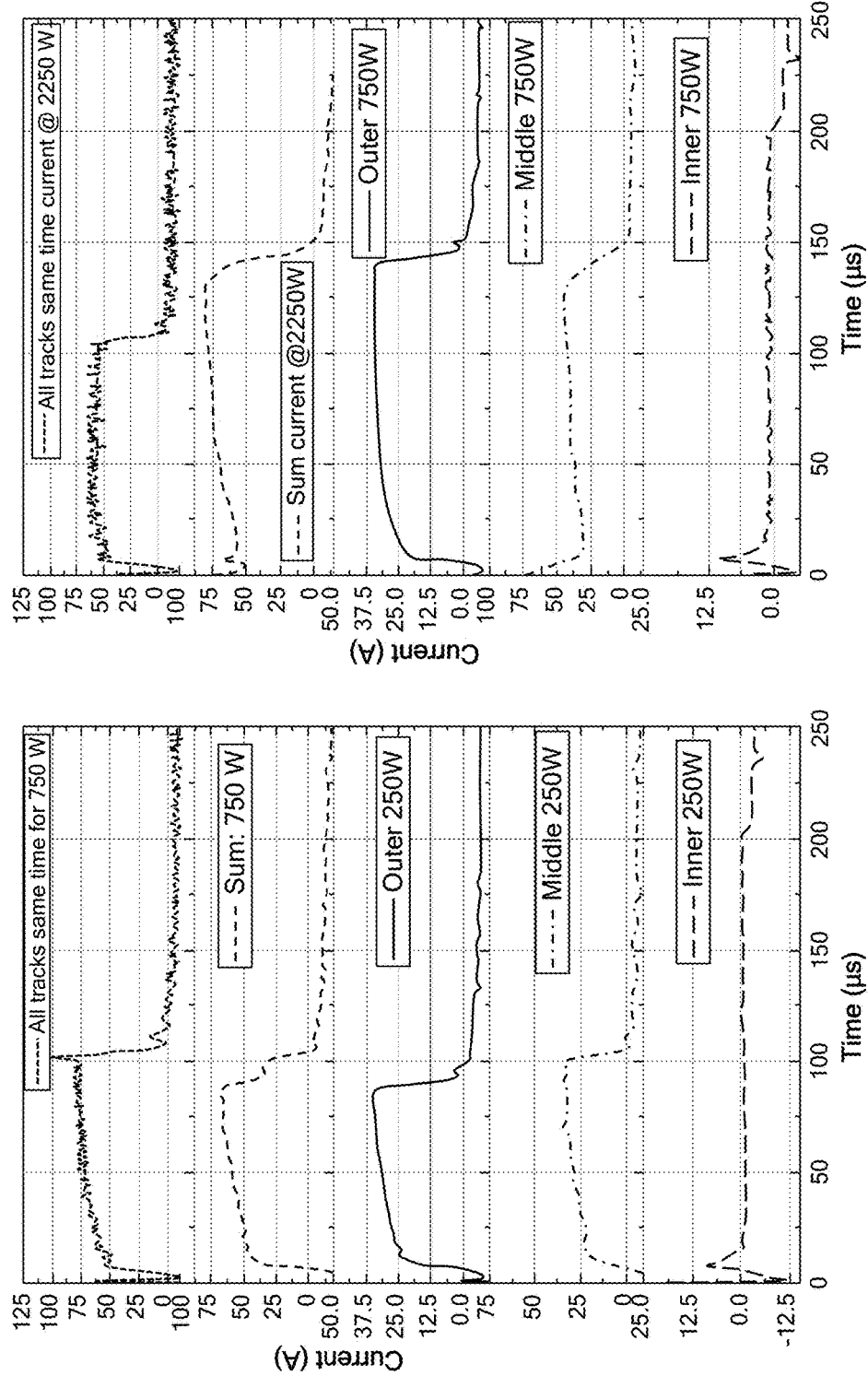
FIGS. 18A and 18B show current traces for the TriPIMS magnet pack.
Figure 19A:
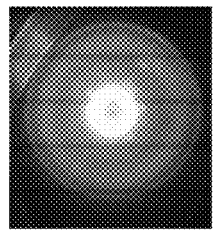
FIGS. 19A-19C are photos showing the TriPIMs magnet pack having a single race track in operation and FIG. 19D is a photo showing the TriPIMs magnet pack with all race tracks operating simultaneously.
Figure 19B:
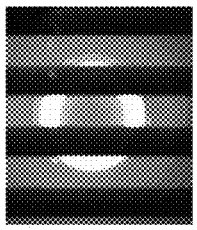
Figure 19C:
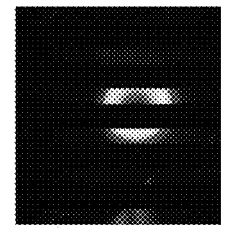
Figure 19D:
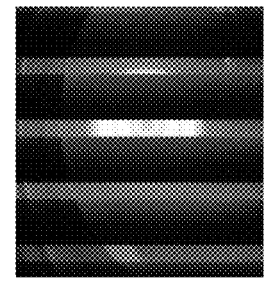

The data in FIGS. 18A and 18B are current traces for the TriPIMS magnet pack (or Tri Pack). The current traces are labeled Inner, Middle, and Outer, and they represent the current in the discharge when only one race track (inner, middle or outer loop) is in operation. The current trace labeled Sum represents an algebraic sum of all of the individual current traces.

The current trace labeled "All tracks same time" represents a current trace for plasma discharge when all three race tracks are operating. The comparison between the current traces for "All tracks at same time" and "Sum" show that when all the race tracks contain a plasma, the discharge has a distinct current limit. For example, the "All tracks same time" is substantially flat after 25 microseconds, which may be referred to as the current limit. However, the current trace for "Sum" does not have a flat region and instead continuously increases as the time of discharge continues. The effect is attributed to the interaction or "cross talk" between race tracks.

For the exemplary magnet assemblies of FIGS. 3A-3B and 7A-7C, the tangential magnetic field $B_{//}$ may alternate between high field values greater than about 200 G and low field values of less than 50 G. The high field values may also be greater than about 250 G. The low field values may also be less than about 30 G. The gradient of the tangential magnetic field $B_{//}$ in the z-direction may alternate between high gradients of least about 1000 G/in and low gradients of at most about 250 G/in. The high gradients may also be at least about 1200 G/in. The low gradients may also be at most about 200 G/in.

Magnets suitable for use in the exemplary magnet assemblies include permanent magnets or electromagnets. Typically, the magnet assemblies include permanent magnets comprising one or more elements selected from the group consisting of: Fe, Ni, Co, Nd, Pr, Dy, Ba, Sr and Pt. For example, the permanent magnets may be selected from the group consisting of: Al—Ni—Co alloys, Fe—Cr—Co alloys, Sm—Co alloys, Pr—Co alloys, Nd—Fe—B alloys, Sm—Fe alloys, Pr—Fe—B alloys, Dy—Fe—B alloys, PtCo alloys, and ceramics comprising Ba, Sr and/or Fe.

The magnet packs may be assembled with the aid of a mechanical jig which holds individual magnets, or pole pieces, in place as they are added one by one. In the end, the entire assembly is often glued or clamped together to maintain its shape. Electromagnetic packs may be assembled from one or more electromagnets prepared by wiring a multi-turn coil onto a magnetically soft material, followed by clamping or gluing to keep shape of the coil.

The magnet assembly designs described above may be advantageously used for HPPMS. To carry out the HPPMS method, a backside of a sputtering target is positioned adjacent to a configuration of magnets in a vacuum chamber and a front surface of the sputtering target is positioned in opposition to a workpiece to be coated. There may be intervening components between the sputtering target and the configuration of magnets. A pulsed plasma is generated at the front surface of the sputtering target at pulsed voltage of at least about 400 V for at least about 10 microseconds to remove atoms from the sputtering target.

The configuration of magnets comprises a magnetic field topology sufficient to: (1) retain a current density on at least a portion of the front surface of the sputtering target of at least about 100 mA/cm$^2$, which allows at least some of the atoms removed from the sputtering target to be ionized, thereby generating a sufficient current to sustain the pulsed plasma; and (2) create an ionization zone between the pulsed plasma and the workpiece away from the front surface of the sputtering target that has a sufficient electron density and temperature to ionize an additional fraction of the atoms removed from the sputtering target. The ionization zone also has a sufficiently low electric field to allow ionized atoms created therein to transit to the workpiece for deposition at a high rate.

A significant advantage of the method is that arcing occurs at a reduced rate (e.g., at least 3 times lower, as shown below) than with a conventional magnet assembly. This may be due at least in part to the cross talk effect discussed above. The cross talk effect can be observed by comparing a first current trace obtained from operating all race tracks simultaneously to a second current trace obtained from operating each race track independently and then summing individual current traces. As shown in FIGS. 18A and 18B and discussed above, the first and second current traces may be different.

The pulsed voltage employed for HPPMS may in some cases be at least about 500 V, at least about 600 V, at least about 700 V, or at least about 800 V. The pulsed voltage may be as high as 1500 V, or as high as 1200 V. Typically the pulsed voltage is between about 500 V and 1000 V. The average power may be at least about 300 W and it may also be at least about 400 W, at least about 500 W, at least about 600 W, at least about 700 W, or at least about 800 W. Typically, the power during one pulse is no higher than about 1,000,000 W for a 4-in. target. The voltage may be maintained for a pulse duration of at least about 15 microseconds, at least about 25 microseconds, at least about 50 microseconds, or at least about 100 microseconds. Typically the pulse duration is no higher than about 3 milliseconds, or no higher than about 1 milisecond. The frequency of the pulsing may be from about 50 Hz to about 10,000 Hz. Typically, the chamber pressure during HPPMS is between about 0.1 mTorr to about 100 mTorr. The deposition rate may depend on the target material, the average power, the gas species and pressure and the relative position of the substrate and the target. In some examples, the deposition rate may lie between about 7 angstroms per second and about 100 angstroms per second. For example, for an aluminum sputtering target, where the HPPMS method described above is carried out at an average power of about 500 W in 10 mTorr of Ar with a substrate-target distance of about 4 inches, the deposition rate may be at least about 7 angstroms per second, or at least about 8 angstroms per second.

EXAMPLES

Experimental Sputter Deposition Set-Up

Sputtering high-purity atomic deposition experiment (SHADE) is a dual magnetron set-up for depositing thin films under an ultra-high vacuum (UHV) environment. FIGS. 12A-12D show the SHADE chamber 1200, which is equipped with a load lock 1202 for sample transfer and a rotatable substrate holder 1204 for increasing the uniformity of deposition, and various structural details of the set-up. The substrate holder 1204 can also be biased if necessary. A 4-in. silicon substrate 1220 is shown schematically in the figures.

For the experiments described here, a 4-in magnetron sputter source (TORUS from Kurt J. Lesker Co.) 1206 is installed in the SHADE chamber 1200 and a number of different power supplies 1208 including Direct Current (Advanced Energy Pinnacle Plus), HPPMS (Huttinger Tru-Plasma Highpulse 4002 DC Generator), Modulated pulse power generator (zPulser) and pulsed DC (Advanced Energy Pinnacle Plus) are used to compare discharge parameters. The stainless steel vacuum chamber 1210 is pumped by oil free vacuum pumps 1212 to a base pressure of $1\times10^{-7}$ Torr. The gas flow in the chamber is controlled by one or more mass flow controllers (MFC) 1214. Typically, the chamber pressure during sputtering is maintained at about 15 mTorr or less. An inert gas such as He, Ar, Ne or Kr, or reactive gas such as $H_2$, $N_2$, $O_2$, or $NH_3$ may be used for sputtering.

For in-situ measurements of deposited film thickness, the SHADE chamber 1200 is equipped with a quartz crystal microbalance (QCM) 1216. The QCM is located 3.4-in from the target and off-axis centered at 2.75 in from the substrate holder, as shown in FIGS. 12A and 12D. To increase the accuracy of the QCM, two QCMs (control and actual) 1216 may be used simultaneously in the same location. The control QCM 1216 is masked with a stainless steel shim stock to subtract the noise from thermal drift.

To verify the QCM deposition rate measurement accuracy, a masked test wafer is placed in the actual QCM 1216 location. The deposited film thickness on the test wafer is measured using a DEKTAK 3030 surface profilometer and it is compared to the QCM thickness readings. The QCM measurement error is found to be in the order of 2%. An aluminum sputtering target 1218 is used in all the experiments. Initial testing of the Epsilon magnet pack is done using a graded aluminum target. The outer rim of the graded aluminum target is 0.125-in thick and the inner portion is 0.09-in thick. This design is chosen to sustain a stable HPPMS discharge. Also visible in FIG. 12D are rough pumps 1222, a pressure gauge 1224, stepper motor 1226, triple probe 1228, motion feed-through 1230, transfer arm 1232 for substrate loading, and a halogen lamp 1234.

Finite Element Analysis Simulations

In this work, one-to-one scale 3D models of the magnet assemblies are built in COMSOL Multiphysics finite element analysis software to simulate the magnetic field topology and electron trajectory above the surface of the sputtering target starting from the target front surface and moving 5 inches in the z direction and 10 inches in x and y directions. The "magnetic and electric field" module (mef) of COMSOL Multiphysics is used to calculate the magnetic flux densities and $B_{//}=(\sqrt{B_x^2+B_y^2})$, where the x-y plane is parallel to the target surface for any given magnet pack arrangement. The distribution of $B_{//}$ above the configuration of magnets is described above for the exemplary magnet assemblies described here.

The Charged Particle Tracing (CPT) module is used to simulate the electron trajectory above the configuration of magnets. In the CPT module, electrons are injected into the race track 2 mm from the target surface with an initial velocity of 200,000 m/s (0.11 eV). This module takes into account electron-to-electron interactions and particle-to-field interactions. The total number of particles in a single simulation run is 1000. In every simulation run, electrons are released at time step zero and the CPT module resolves particle position at every 0.1 ns. This model for particle tracing is a simplistic way to visualize single particle trajectories and is not intended to directly describe physical phenomena in the HPPMS discharge. However, it allows reconstructing a general behavior of electrons in the trap. To verify the accuracy of the modeling, a conventional magnet assembly that gives rise to a single circular race track on the target surface was evaluated prior to carrying out the analysis described in detail here.

Figure 21:
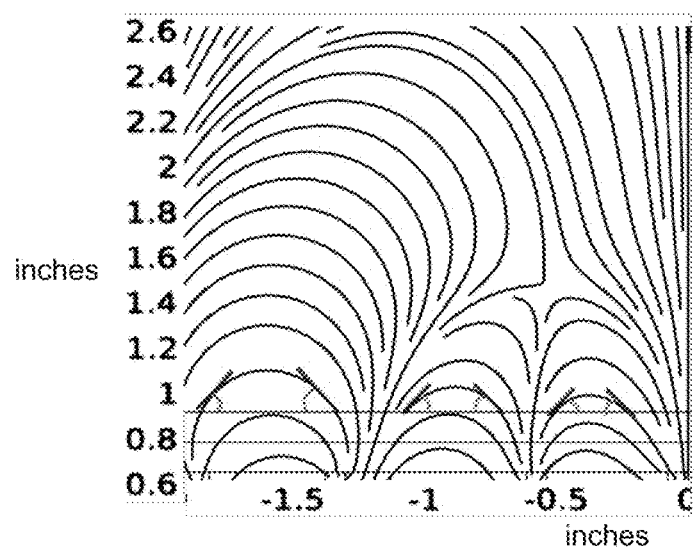
FIG. 21 shows an exemplary a total magnetic field ($B_{tot}$) distribution on an x-z plane along with tangent lines that may be used to determine values of race track width.

As used herein, the term "conventional magnet assembly" or "conventional magnet pack" refers to magnets configured to generate a single circular race track. The race track generated by a magnet pack may be visualized in several ways. As discussed above, the tangential magnetic field $B_{//}$ distribution on an x-y plane above the magnet assembly as determined by finite element analysis simulations illustrates the race track. A cross-sectional view of the race track may be observed in reference to the $B_{tot}$ distribution on an x-z plane intersecting the configuration of magnets, as described above. Using the $B_{tot}$ distribution, the width of the race track may be defined as the distance on the target surface between two points where a tangent to a magnet field line forms an angle between about $\pm(35°$ to $55°)$, as shown for example in FIG. 21. In addition, the surface of the sputtering target develops an erosion pattern during sputtering that shows the race track (e.g., see FIGS. 16A-16B). Thus, the width of the erosion pattern (specifically, the width of an erosion track between unsputtered edges of target material and measured in a radial direction) may be used to define the width of the race track. Typically, the width of the race track for the Epsilon and TriPIMS magnet packs ranges from about 10 mm to about 25 mm, but the width is not limited to these values and may vary depending on a number of factors.

Figures 13A, 13B, 13C, 13D, 13E:
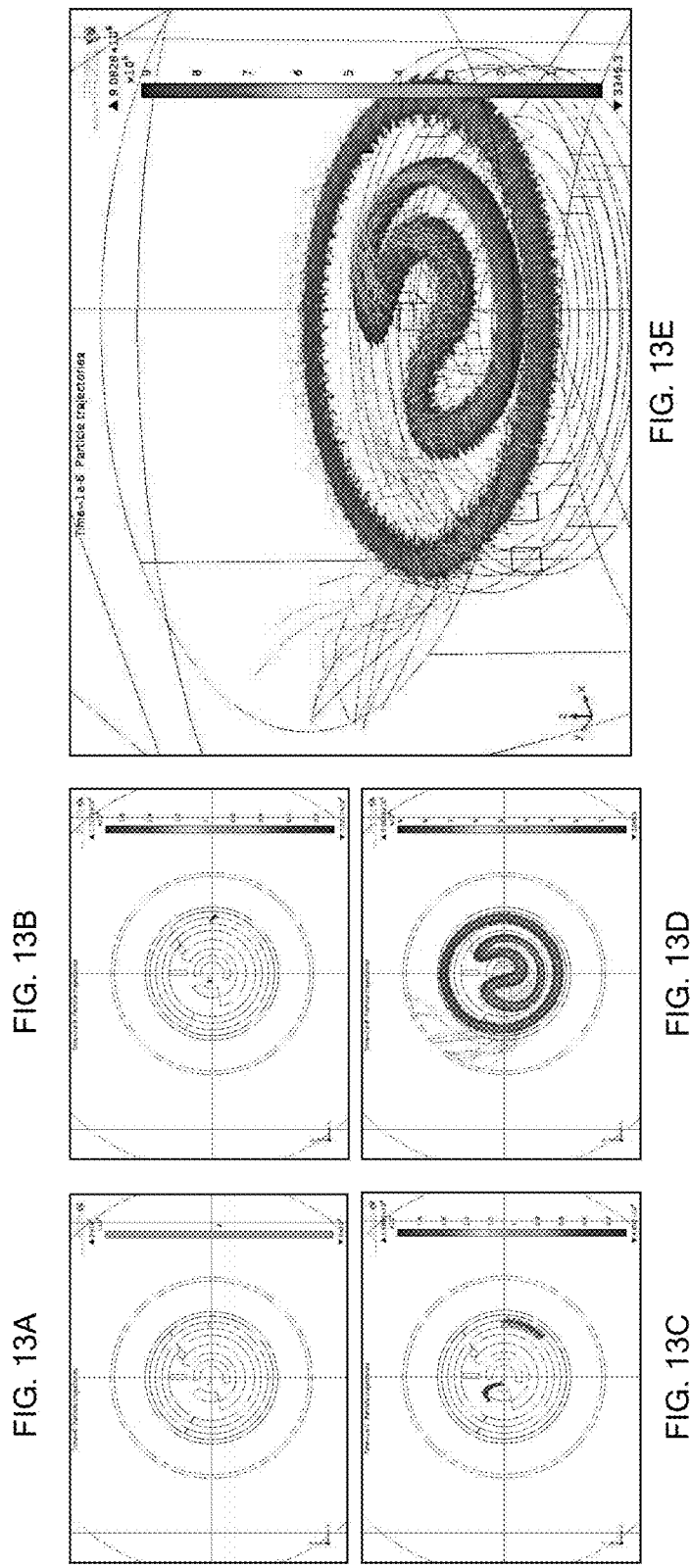
FIGS. 13A-13E show the electron trajectory of the Epsilon magnet assembly at times (a) t=0, (b) t=10 ns, (c) t=100 ns, and (d-e) t=1000 ns.
Figure 14:
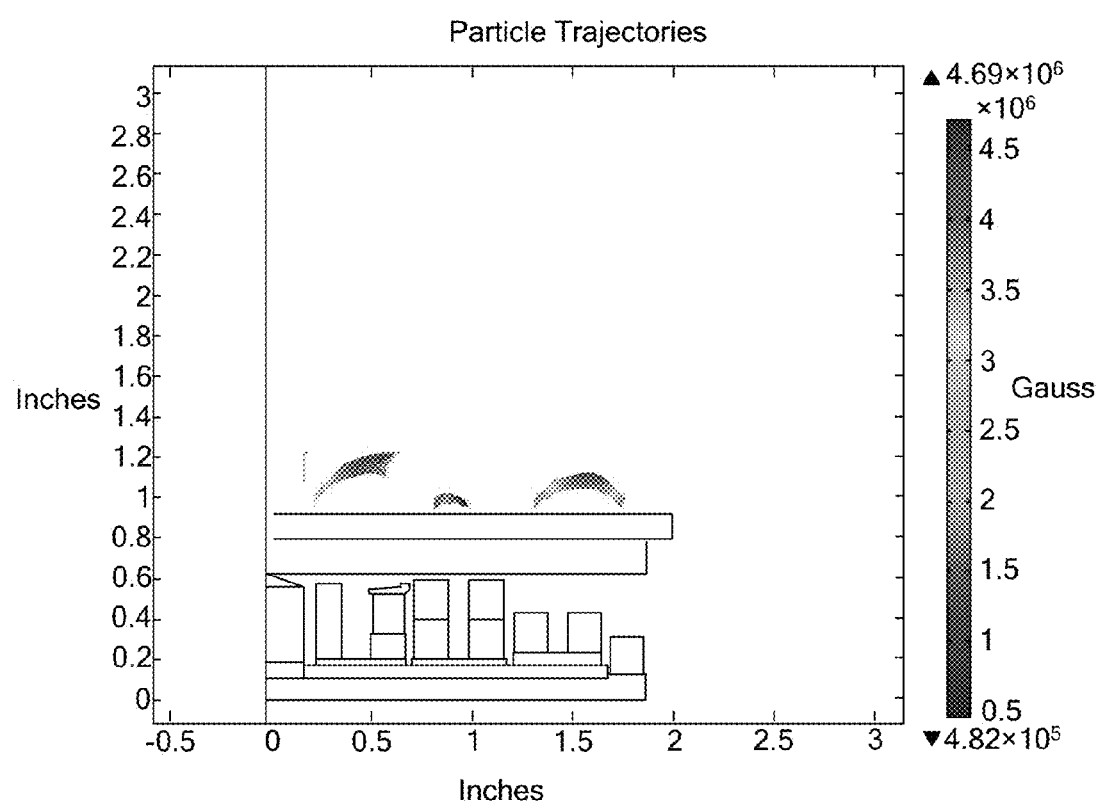
FIG. 14 shows electron trajectories for the TriPIMS magnet assembly.

FIGS. 13A-13E show the electron trajectory of the Epsilon magnet assembly at times (a) t=0, (b) t=10 ns, (c) t=100 ns, and (d) t=1000 ns. FIGS. 13D and 13E show the electron trajectory at time t=1000 ns in a top view and a perspective view; the confinement and electron loss paths of this magnet assembly can be observed. The magnet assembly sustains discharges with volt-ampere characteristics that follow a well-known magnetron mode I $\propto V^n$ relationship, where n is the performance index of the electron trap, as described in Thornton, John A. "Magnetron Sputtering: Basic Physics and Application to Cylindrical Magnetrons," *Journal of Vacuum Science and Technology* 15.2 (1978): 171-177, which is hereby incorporated by reference. FIG. 14 shows an electron trajectory plot for the TriPIMS magnet assembly in the x-z plane. It was not run for as long of a time, but shows the same behavior of electrons being able to move from the outer ring to inner rings.

Deposition Rates and Uniformity

Epsilon Magnet Pack

Figure 15:
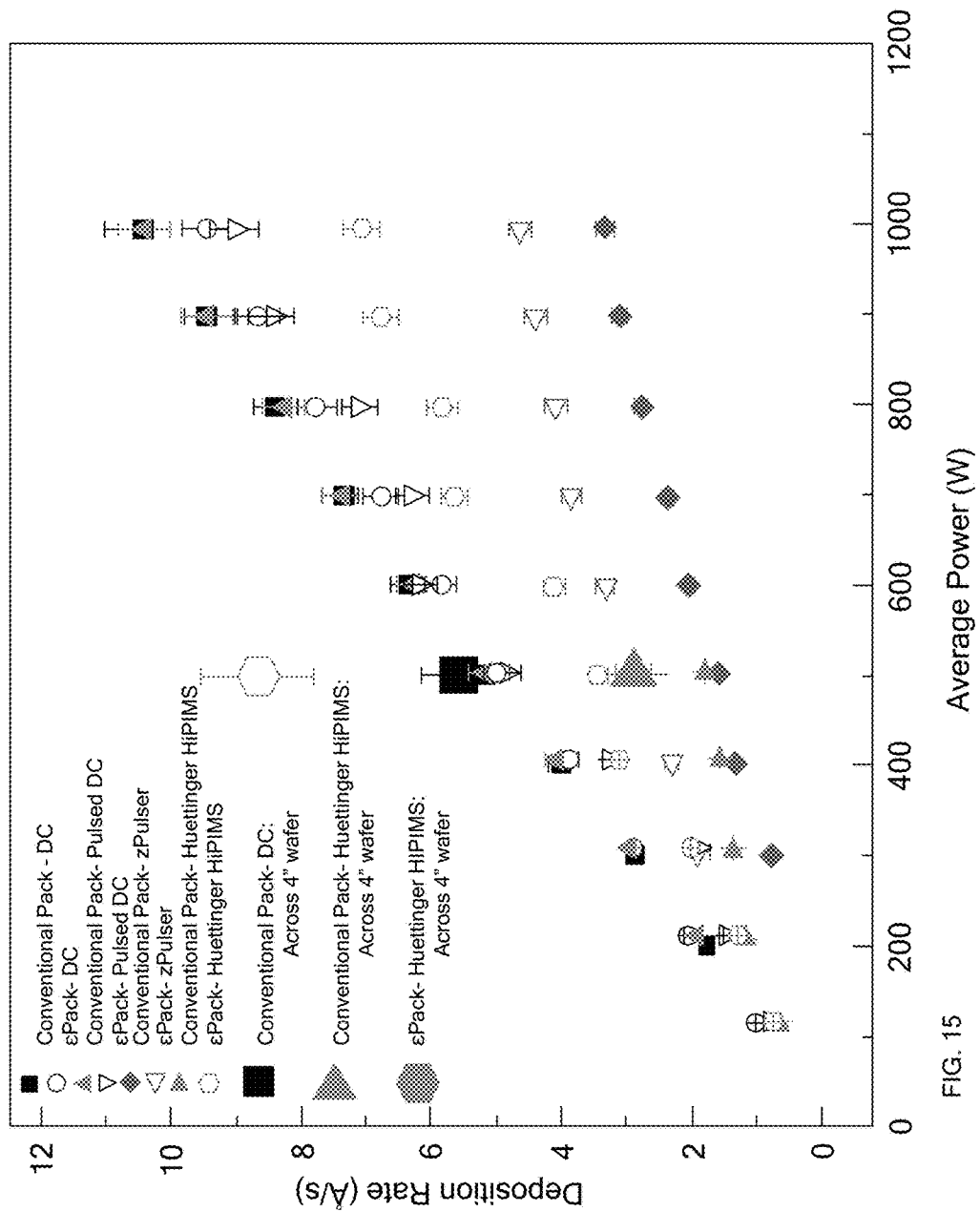
FIG. 15 shows deposition rate as a function of average power for the Epsilon magnet assembly in comparison with a conventional magnet assembly when used with different power supplies.

FIG. 15 provides a summary of QCM deposition rates and average deposition rates across the 4-in wafer using different power supplies at 10 mTorr and 15 mTorr, respectively, for the Epsilon magnet assembly in comparison with the conventional magnet assembly described above. The data labeled "across 4" wafer" are averaged across all positions of a 4-in wafer placed 4-in away from the sputtering gun.

In FIG. 15, solid data points represent the conventional magnet assembly and hollow data points represent the Epsilon magnet pack. It can be seen that, for the Epsilon pack, the Huettinger HiPIMS power supply gives higher deposition rates than the MPP zPulser power supply, and also it gives twice higher deposition rates than the conventional pack HiPIMS discharges for the same average power. The oversized data points represent the deposition rates measured on a 4" line of sight silicon substrate, which are described below. The regular-sized data points represent the deposition rates measured using QCM at an off center position from the target, as shown in FIG. 12A. Due to asymmetry of the Epsilon magnet pack, the deposition rates are measured for different orientations of the pack. This is done by rotating the magnetron gun every 90 degrees along the central (z) axis and recording the deposition rates from the QCM. The deposition rates from the four different orientations are found to be accurate to the order of less than 1%. Deposition rates beyond 500 W are not presented for the conventional pack due to the melting of the target. It can be seen from the data of FIG. 15 that the Epsilon pack Huettinger HiPIMS deposition rates at the off-center position reach almost 80% of conventional DC sputtering at an average power of 400 W. Also, the averaged rate across the entire deposition field exceeds the DC magnetron sputtering rate by a factor of 1.5.

In order to test the uniformity of deposition, 4-in silicon wafers with silicon masks are placed four inches coaxially away from the target, as shown in FIGS. 12B and 12C. The thickness of the deposited films are measured using a DEKTAK 3030 profilometer for the Epsilon pack Huettinger HiPIMS, conventional pack HiPIMS and conventional pack DC at 15 mTorr and 500 W average power. In the Epsilon magnet pack, deposition is much higher in the regions where the race track density is higher. The overall uniformity of the Epsilon magnet pack is similar to that of the conventional pack. A summary of the results for an aluminum (Al) sputtering target is presented in Table 1.

TABLE 1

Deposition Rates for Epsilon vs. Conventional Magnet Pack

| Magnet Pack | DC Deposition Rate (Å/s) | HiPIMS Deposition Rate (Å/s) |
| --- | --- | --- |
| Conventional | 5.6 ± 0.6 | 2.8 ± 0.3 |
| Epsilon | — | 8.7 ± 0.9 |

Average deposition rates for all positions with Epsilon magnet assembly using a Huettinger power supply (HiPIMS) is 8.7±0.9 Å/s for an aluminum target positioned 4 inches from the top surface of the magnet pack. The average deposition rate with the conventional magnet pack with HiPIMS is 2.8±0.3 Å/s, and the average deposition rate for the conventional magnet pack using conventional DC magnetron sputtering is 5.6±0.6 Å/s. The oversized data points in FIG. 15 represent average deposition rates on the 4-in silicon substrate. The Epsilon magnet pack with Huettinger HiPIMS power supply gives a 1.5 times higher deposition rate than the conventional pack with a DC discharge when the substrate is placed in the line of sight of the target.

The total race track length for the conventional magnet pack is 9.35 in and for the Epsilon magnet pack is 18.7 in, as can be seen in FIGS. 16A and 16B, respectively, which show the erosion pattern on the sputtering target surfaces. The total erosion area for the conventional magnet pack is 10.2 in$^2$ and 9.1 in$^2$ for the Epsilon magnet pack. Note that the Epsilon magnet pack can give full-face target erosion if rotated, and may yield a larger area of erosion when stationary compared to the conventional magnet pack.

The deposited aluminum films are characterized using FIB DB 235. Films deposited with the Epsilon magnet pack using a DC power supply have a larger grain size compared to films deposited with the Epsilon magnet pack using the zPulser MPP and Huettinger HiPIMS power supplies, as shown in FIGS. 17A-17F. The films deposited with the Epsilon magnet pack using the Huettinger HiPIMS and zPulser MPP power supplies have smaller grains. Plasma parameters, such as $n_e$ and $T_e$, were measured using a triple Langmuir probe (TLP) set-up as described in H. Yu et. al., "Investigation and optimization of the magnetic field configuration in high-power impulse magnetron sputtering," *Plasma Sources Science and Technology* 22.4 (2013): 045012, which is hereby incorporated by reference. Peak electron density and temperature at a distance of 90 mm from the target on the central axis of the target are found to be approximately $6\times10^{17}$ m$^{-3}$ and about 6 eV, respectively, for the Epsilon magnet pack with Zpulser MPP at a pressure of 15 mTorr and at an average power of 500 W.

TriPIMS Magnet Pack (or TriPack)

The following deposition rates were measured from a mass change of a 2-in. silicon wafer before and after a one hour deposition experiment using the TriPack. These deposition rates were obtained using a titanium target at pressure of 13 mTorr with a throw distance of 3 inches.

TABLE 2

Deposition Rates for TriPack vs. Conventional Magnet Pack

| Power Supply Type | Conventional Pack Deposition Rate (Å/s) | TriPack Deposition Rate (Å/s) |
| --- | --- | --- |
| DC | 9.1 ± 1.4 | — |
| Starfire "Impulse" for HiPIMS | 4.0 ± 0.6 | 7.1 ± 1.1 |

Figure 20:
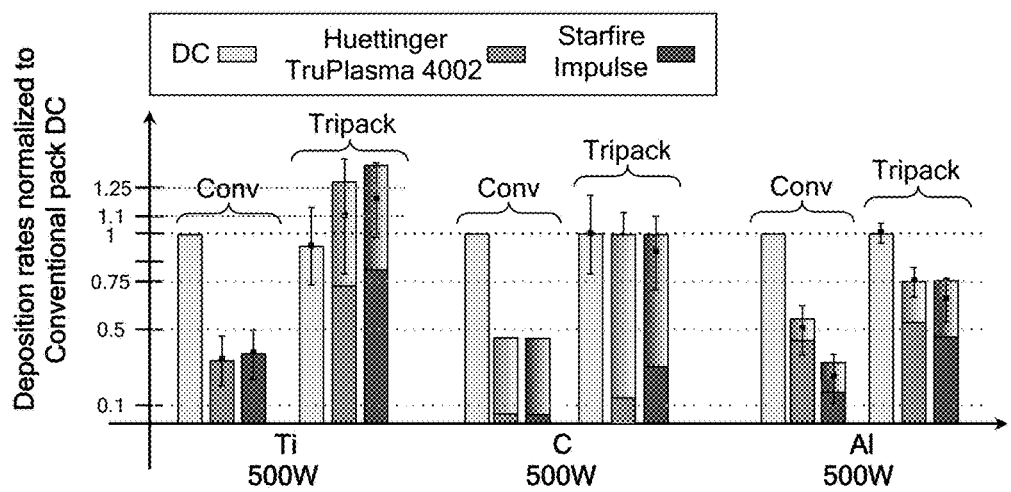
FIG. 20 is a plot of deposition rates from a conventional magnet pack and the TriPIMS magnet pack with titanium, carbon and aluminum targets at 13 mTorr; the data are normalized to the DC deposition rates with the conventional magnet pack.

FIG. 20 shows a plot of deposition rates from the conventional magnet pack and the TriPack using titanium, carbon and aluminum targets at 13 mTorr. The deposition rates are normalized to the DC deposition rates with the conventional pack. All deposition rates on titanium were measured from a "cold" titanium target. The gradients on the bar plot represent the range of deposition rates that can be obtain by varying pulsing parameters but keeping the average power at 500 W. The black error bars represent the error in acquiring QCM data during the experiments. DC deposition rates with the conventional pack were about 1 Å/s for titanium, about 0.1 Å/s for carbon and about 12 Å/s for aluminium at 4 inches away from the target.

It can be observed that the TriPack with HiPIMS power supplies (Huettinger and Starfire Impulse) gives higher deposition rates compared to the conventional pack DC in the case of a titanium target. By changing the pulsing parameters in the TriPack carbon target, it was possible to obtain conventional DC rates with the HiPIMS power supplies. In the case of the TriPack with an aluminum target, the HiPIMS deposition rates were lower than conventional DC but much higher than the HiPIMS deposition rates using a conventional magnet pack. In FIG. 20, the gradient shading represents the magnitude of the deposition rate variation due to the variation in pulsing parameters.

Arc counts were also obtained during sputter deposition of an aluminum target at an average power of 500 W. The average power was calculated by $$P = \frac{1}{T}\int_0^T V(t)I(t)\,dt,$$

where T is one minute, V(t) is discharge voltage, I(t) is discharge current, and P is average power. An arc event may be defined as a one time event during a single pulse of HPPMS discharge when the magnetron discharge transits to an arc discharge. The power supply stops supplying power to the magnetron once it senses the transition event and returns to normal operation after a few milliseconds; thus only one transition may occur during a given pulse.

Table 3 compares the arc counts per minute obtained using a conventional magnet pack in comparison with the TriPIMS magnet pack during HPPMS of an aluminum target. As can be seen, there is a significant decrease in the arc rate. Generally speaking, the arc rate is at least about 3 times lower using the Tri Pack compared to the conventional magnet pack, and the arc rate may also be at least about 4 times lower, at least about 5 times lower, or at least about 6 times lower, as indicated in Table 3. The arc rate of the TriPack may be up to an order of magnitude lower than with the conventional magnet pack.

TABLE 3

Rate of Arcing of Conventional Magnet Pack Compared to TriPack

| Average Power (W) | Magnet Pack | Arc counts/minute |
| --- | --- | --- |
| 500 | Conventional | 18 |
|  | TriPack | 3 |

Figure 22A:
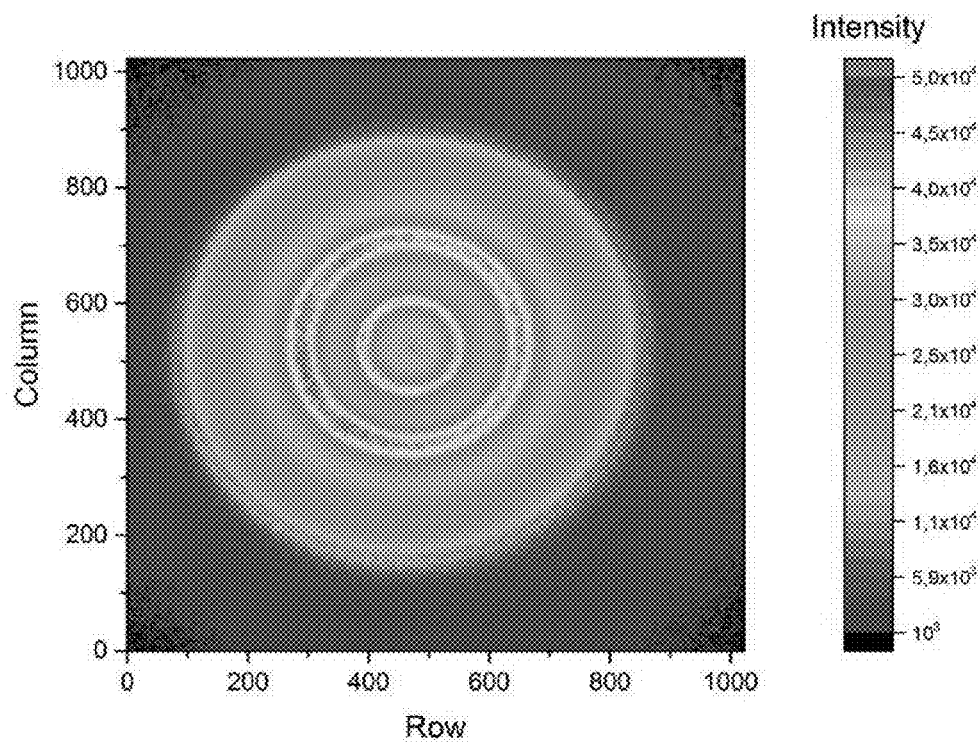
FIG. 22A shows an ICCD image of magnetron discharge for a TriPIMS magnet pack (TriPack)
Figure 22B:
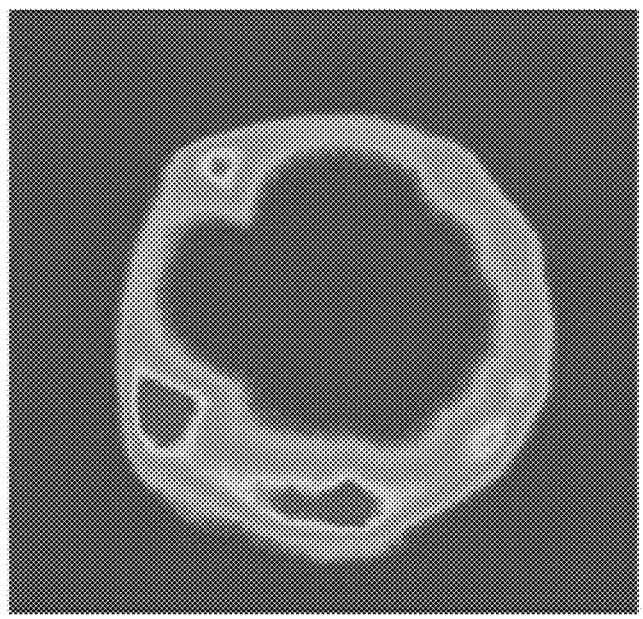
FIG. 22B shows an ICCD image of magnetron discharge for a conventional magnet pack; hot zones may be seen in FIG. 22B.

The reduction in arcing may be attributed at least in part to the reduction in rotating "hot zones," which in turn may be related to the defined width of the race track, as discussed above. Hot zones may be understood in reference to FIGS. 22A and 22B, which were taken with an ICCD camera and show the intensity of light emitted from the magnetron discharge for an exposure time of 1 to 15 nanoseconds for the Tri Pack and the conventional magnet pack, respectively. The color table goes from blue to red, with red representing the maximum intensity. As can be seen from the Tri Pack image, the circles exhibit homogeneous colors, whereas the conventional magnet pack image shows discrete red spots, or hot zones.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A magnet assembly for use in high power pulsed magnetron sputtering, the magnet assembly comprising:
a configuration of magnets having a magnetic field topology comprising magnetic field components $B_x$, $B_y$ and $B_z$, where x- and y-directions are parallel to the configuration of magnets and a z-direction is normal to the configuration of magnets,
wherein a tangential magnetic field $B_{//}$ distribution on an x-y plane above the configuration of magnets comprises an outer continuous ring and one or more inner continuous rings contained in the outer continuous ring, and
wherein a total magnetic field $B_{tot}$ distribution on an x-z plane intersecting the configuration of magnets comprises an outer closed loop and one or more inner closed loops contained in the outer closed loop, where, as a function of x, a tangential magnetic field $B_{//}$ alternates between (a) high field values greater than 200 G and high gradients in the z-direction of at least 1000 G/in, and (b) low field values of less than 50 G between the continuous rings and low gradients in the z-direction of at most 250 G/in.

2. The magnet assembly of claim 1, wherein a direction of the tangential magnetic field $B_{//}$ changes by 180° between adjacent continuous rings in at least some locations.

3. The magnet assembly of claim 1, wherein a gradient of the tangential magnetic field $B_{//}$ in the x-y plane along any of the continuous rings is less than about 200 G/in.

4. The magnet assembly of claim 3, wherein the gradient of the tangential magnetic field $B_{//}$ in the x-y plane along any of the continuous rings is less than about 100 G/in.

5. The magnet assembly of claim 1, wherein the x-y plane above the configuration of magnets is positioned where a front surface of a sputtering target is located during sputtering.

6. The magnet assembly of claim 1, wherein an average value of the tangential magnetic field $B_{//}$ in the inner continuous ring is less than an average value of the tangential magnetic field $B_{//}$ in the outer continuous ring.

7. The magnet assembly of claim 6, wherein the tangential magnetic field $B_{//}$ in the outer continuous ring comprises a value from about 600 G to about 1000 G.

8. The magnet assembly of claim 1, wherein an average value of the tangential magnetic field $B_{//}$ in the inner continuous ring is greater than an average value of the tangential magnetic field $B_{//}$ in the outer continuous ring.

9. The magnet assembly of claim 8, wherein the tangential magnetic field $B_{//}$ in the outer continuous ring comprises a value from about 450 G to about 1025 G.

10. The magnet assembly of claim 9, wherein the tangential magnetic field $B_{//}$ distribution on the x-y plane further comprises an innermost continuous ring contained in the inner continuous ring.

11. The magnet assembly of claim 10, wherein the outer, inner, and innermost continuous rings are concentric.

12. The magnet assembly of claim 1, wherein the tangential magnetic field $B_{//}$ alternates between (a) the high field values and the high gradients and (b) the low field values and the low gradients at values of z within about 0.4 inch from the configuration of magnets.

13. The magnet assembly of claim 1, wherein the high field values are greater than about 250 G and low field values are less than about 30 G.

14. The magnet assembly of claim 1, wherein the high gradients are greater than about 1200 G/in and low gradients are less than about 200 G/in.

15. The magnet assembly of claim 1, where the configuration of magnets comprises a complete outer magnet ring and two complete inner magnet rings positioned inside the complete outer magnet ring, each of the magnet rings comprising one or more elements selected from the group consisting of: Fe, Ni, Co, Nd, Pr, Dy, Ba, Sr and Pt.

16. The magnet assembly of claim 15, wherein each of the outer and inner magnet rings are circular in shape with a substantially constant radius.

17. The magnet assembly of claim 1, wherein the configuration of magnets comprises a plurality of magnets arranged to define two complete outer magnet rings and two partial inner magnet rings positioned inside the two complete outer magnet rings, each of the magnet rings comprising one or more elements selected from the group consisting of: Fe, Ni, Co, Nd, Pr, Dy, Ba, Sr and Pt.

18. The magnet assembly of claim 17, wherein the two partial inner magnet rings comprise a smaller partial inner magnet ring positioned radially inside a larger partial inner magnet ring.

19. The magnet assembly of claim 18, further comprising a curved, circumferentially-oriented magnet piece positioned between an end of the smaller partial inner magnet ring and an end of the larger partial inner magnet ring, and
   further comprising a straight, radially-oriented magnet piece positioned adjacent to an end of the larger partial inner magnet ring.

20. The magnet assembly of claim 1, wherein, during use, fewer arcs are generated than with a conventional magnet assembly.

21. The magnet assembly of claim 1, wherein, during use, a magnetron discharge generated thereby does not contain hot zones.

* * * * *